United States Patent [19]

Ingalls et al.

[11] 4,425,417

[45] Jan. 10, 1984

[54] METHOD FOR PREPARATION OF A COLOR PROOF FROM A SET OF COLOR SEPARATION FILMS, MASKS OR THE LIKE

[76] Inventors: Marjorie D. Ingalls; Richard D. Ingalls, both of E. 1104 57th, Spokane, Wash. 99203

[21] Appl. No.: 353,399

[22] Filed: Mar. 1, 1982

Related U.S. Application Data

[63] Continuation-in-part of Ser. No. 76,499, Sep. 17, 1979, abandoned, which is a continuation of Ser. No. 7,702, Jan. 30, 1979, abandoned, which is a continuation-in-part of Ser. No. 794,987, May 9, 1977, abandoned.

[51] Int. Cl.³ .................................................. G03C 5/04
[52] U.S. Cl. ....................................... 430/30; 430/293; 430/358
[58] Field of Search .................. 430/30, 143, 293, 358

[56] References Cited

U.S. PATENT DOCUMENTS

| | | | |
|---|---|---|---|
| 1,703,449 | 2/1929 | Heubner | 430/30 |
| 2,518,947 | 8/1950 | Simmon | 430/30 |
| 2,850,563 | 9/1958 | Gretener | 178/5.2 |
| 3,027,801 | 4/1962 | Simmon | 355/88 |
| 3,152,897 | 10/1964 | Huboi et al. | 430/30 |
| 3,322,025 | 5/1967 | Dauser | 355/88 |
| 3,576,627 | 4/1971 | Wirth | 430/358 |
| 3,674,364 | 7/1972 | Korman | 355/38 |
| 3,709,686 | 1/1973 | Erdell | 430/7 |
| 3,741,649 | 6/1973 | Podesta et al. | 355/88 |
| 3,796,575 | 3/1974 | Kirsch | 430/358 |
| 3,913,477 | 10/1975 | Howland | 430/30 |
| 4,259,423 | 3/1981 | Merlo | 430/358 |

FOREIGN PATENT DOCUMENTS

| | | |
|---|---|---|
| 729004 | 4/1955 | United Kingdom . |
| 945372 | 12/1963 | United Kingdom . |
| 1048581 | 11/1966 | United Kingdom . |
| 1123420 | 8/1968 | United Kingdom . |
| 1259134 | 1/1972 | United Kingdom . |
| 1282602 | 7/1972 | United Kingdom . |
| 1481242 | 7/1977 | United Kingdom . |

OTHER PUBLICATIONS

*Principles of Color Technology*, Billmeyer & Saltman, John Wiley & Sons, 1966, pp. 22–144.

*Kodak Filters For Scientific and Technical Use*, Eastman Kodak Company, New York, 1973, pp. 8-10, 12-25, 30-32, 34-36, 47-51, 57, 58.

*The Reproduction of Colour*, R. W. G. Hunt, Fountain Press, London, 1967, p. 101.

*The Science of Color*, Optical Society of America Committee on Colorimetry, New York, 1953, p. 241.

*Color Science*, Wyszecki & Stiles, John Wiley & Sons, pp. 48, 240, 241.

*Handbook of Colorimetry*, Hardy, Technology Press, 1936, pp. 6, 7, 9, 10.

*Printing Impressions*, North American Publishing Company, Article entitled, "The Problems of Matching Color Samples" by F. L. Wurzburg, Jr., pp. 48, 49.

*The Reproduction of Colour*, R. W. G. Hunt, Fountain Press, Hertfordshire, England, Third Edition, 1975, Title Sheet and p. 546.

*Color Proofing, A Colorful Guide to Pre-Press Proofing from 3M*, a six page leaflet available from 3M Company, bearing numeral identification 324-2264-220.

*3M Brand "Color-Key" Negative Acting Contact Imaging Material*, a two-page leaflet available from 3M Company, bearing alphanumeric designation O-TNCK-R (107.5) MP.

*ENCO "Naps" Negative-Acting Pre-Plate Color Proofing Film System*, a four page brochure available from Azoplate Division of American Hoechst Corporation, Murray Hill, N.J., bearing alphanumeric identification number JT-74-7, Nov. 1974.

*NAPS Color Proofing Film*, a four page leaflet available from Azoplate Division of American Hoechst Corporation, Murray Hill, N. J., bearing alphanumeric identification number JT-76-9.

*Cormalin Color Proofs . . . Better, Faster, Less Expensive than Press Proofing!*, a sixteen page booklet available from E. I. DuPont de Nemours & Co. (Inc.), bearing alphanumeric identification No. E-18361.

*Primary Examiner*—J. Travis Brown
*Attorney, Agent, or Firm*—John O. Graybeal

[57] ABSTRACT

The reproduction of one or more target colors on photographic media directly by use of a light source and a selected group of color filters, such as for preparation of a multi-color pre-press color proof, each of the target colors being reproduced by:

(a) illuminating the target color with the given light source or equivalent thereof and determining the proportion of the three primary colors which constitute said target color by comparing the target color to a color reference data base comprising a plurality of colors constituted of said primary colors under illumination by a like light source whereby to select from said data base a reference color most similar to the target color and thereby identify a group of one or more color filter elements usable to reproduce the reference color;

(b) determining the exposure time of each color filter element required substantially to reproduce the reference color and thus the target color on the color sensitive photographic material when developed;

(c) exposing undeveloped color sensitive photographic material through each color filter element for a period corresponding to the exposure time thus determined for each respective color filter element; and (d) developing the exposed color sensitive photographic material thereby substantially to reproduce the target color thereon.

25 Claims, 8 Drawing Figures

METHOD FOR PREPARATION OF A COLOR PROOF FROM A SET OF COLOR SEPARATION FILMS, MASKS OR THE LIKE

CROSS REFERENCE TO RELATED APPLICATIONS

The present application is a continuation-in-part of copending and now abandoned application Ser. No. 76,499, filed Sept. 17, 1979, and entitled Method of Obtaining One or More Target Colors from a Light Source on Photographic Paper or the Like, and Multi-Color Proofing Procedure Utilizing Same, which application in turn is a continuation of our now abandoned application Ser. No. 7,702, filed Jan. 30, 1979, and entitled Method of Obtaining a Target Color from a Light Source on Photographic Film or Paper, which application is in turn a continuation-in-part of our now abandoned application Ser. No. 794,987, filed May 9, 1977, with like title.

BACKGROUND OF THE INVENTION

1. Field of the Invention

The method of the present invention relates in general to the field of synthesizing one or more colors directly on color sensitive photographic media by the exposure thereof to an illuminant source through a group or set of color filter elements. More particularly, the method of the present invention relates to the reproduction of a desired color (the target color) by illuminating the target color with a light source and determining the exposure time needed for each color filter of a selected set of color filter elements to reproduce the target color by exposing a photographic medium to the same or like light source through said set of color filter elements. One application of the method is the preparation of single sheet pre-press color proofs from color separation films, masks or the like.

2. Description of the Prior Art

In a classic experiment which was performed by Newton as early as the year 1730, light from a test lamp was shown on a white screen and viewed by an observer. An adjacent part of the screen was illuminated by three different light sources equipped to give light of widely differing colors, typically, red, green and blue. Interestingly, it was found that by adjusting the intensities of the three colored light sources, they could be made to produce a combined light on the screen which would match that of the test lamp. This basic experiment teaches that light from three different colored light sources, commonly referred to as the primary lights, can combine to reproduce a test color by a technique known as additive color matching.

Following the advent of color photography, it was noted that shining primary lights of different colors on the same piece of photographic media produced an image thereon of combined color which was different from the color of each individual primary light. Such a concept is disclosed in U.S. Pat. No. 3,741,649, issued June 26, 1973, to Podesta et al. However, Podesta discloses merely an empirical system whereby, through trial and error, light is projected through a multitude of combinations of filters onto photographic media which is then developed to discover what usable color, if any, has been obtained. By noting which filters were used, some rudimentary repeatability of results was attainable. However, the method disclosed by Podesta makes no provision for reproducing a randomly selected target color and makes no provision for duplicating such a target color when a light source having a different color temperature is used, or when filters are used which are of colors different from those already used.

U.S. Pat. No. 3,322,025, issued May 30, 1967, to Dauser, discloses a somewhat more sophisticated, but still empirical method which involves the production of a cylindrical color solid wherein each colored segment is identified by its hue, value and intensity. The color solid is generaated, apparently, by varying the voltages to three primary light sources, red, green and blue, thereby to regulate their intensities and thus produce the various colored segments comprising the color solid. Repeatability is obtained by noting the voltage input or light output of each of the respective lamps needed to produce each colored segment in the color solid.

However, such a system is severely limited since it provides only for producing the cylindrical color solid by the use of three colored lights which together are able to form achromatic light. If it is desired to use three lights which are unable to form achromatic light, what technique to use is undisclosed. Further, if a different set of achromatic lights is used, it is clear that the first produced color solid is useless and that a new color solid must be prepared for each different set of lights employed. In addition, the method's ability to faithfully reproduce a color segment is questionable since it is well known that the color properties of photographic media vary from manufacturer to manufacturer and from lot to lot. How Dauser would compensate for such variations without regenerating a complete color solid for each batch of photographic paper used is not disclosed. In addition, it is well known that the color temperature of even standardized light sources changes with age and hence the colors they produce similarly change. Again, how such aging is compensated for, without the periodic reconstruction of a complete color solid, is a problem not addressed by Dauser. Further, it is well known that varying the voltage to a light source is a crude way to regulate its intensity since as the bulb dims or brightens, the color produced by the bulb also changes. Apparently, Dauser failed to consider this variable which would tend to make his color solid nonlinear. Lastly, if both positive and negative photographic media were to be used, apparently a separate color solid would have to be generated for each, a costly and time-consuming process.

U.S. Pat. No. 2,850,563, issued Sept. 2, 1958, to Gretener uses a chromaticity diagram as a theoretical basis for explaining his method of more accurately reproducing images in color through the use of photography or television. Primarily, his method achieves accurate color reproduction by properly adjusting the spectral response of the recording apparatus. For reproducing flesh tones, the spectral response is adjusted in such a manner that the flesh tones are recorded with color components having an intensity of equal size, i.e., having a unitary ratio, or in thge preferred case, with only the red and green components having substantially equal intensities. It is noted that the thrust of the Gretener patent is directed towards a method of unitizing the ratio of at least two of the primary colors.

The Gretener patent fails, however, to disclose a method by which a target color may be produced on positive photographic media by calculating the exposure time needed of suitable color filter elements representative of each of the primary color components of the target color. In addition, no method is disclosed in Gretener by which one may calculate the proper exposure times for each of the selected color filter elements using a given light source such that when negative photographic media is exposed thereby, the target color will result on the developed media.

The color reproduction technique of the present invention also is applicable to the color printing field, particularly to the preparation of color proofs from color separation components in the form of films, masks or the like. Conventional practice with respect to color proofing involves either actual press proofing (a procedure wherein actual test printing plates are made to literally color print the proof) or by use of primary color and black transparent overlays. 3M Company markets, under the trademark "Color-Key", pre-press proofing materials involving pre-sensitized ink pigment coatings, in either transparent or opaque colors, on transparent polyester base sheets. Each pigment coating is intended to be correlated with various process color printing inks. Each primary color and black "Color-key" Sheet is overlaid by its associated separation negative and after exposure and development, the four "Color-Key" sheets are overlaid in register to provide a "proof" or simulation of what the four-color work will look like when printed. Manifestly, such a pre-press proofing system, involving four overlaid sheets (which are glossy in character and which at best only indirectly match the colors of the proof with the actual colors of the printing inks to be used) falls well short of providing the user with a fully accurate proof in the sense of the colors, color registry and texture of the color work when press printed with inks on paper.

3M Company also markets a pre-press color proofing system under the trademark "Transfer-Key", which is said to provide a complete four-color proof on a single sheet. In this system, factory pre-coated carrier sheets of color pigment, respectively bearing cyan, yellow, magenta and black pigment, are successively manipulated to laminate each pigment onto the base material by use of a proprietary laminator. Specifically, the cyan pigment is first laminated to the base material, which is then exposed to the cyan separation negative and the sheet then developed in a proprietary processor. The same exposure/development cycle is repeated with each color, producing the four-color proof. Pre-coated pigment carrier sheets are available only in certain colors, unless specially ordered. As manifest, such color proofing procedure, although providing a single sheet color proof, is of limited applicability and accuracy in that only certain laminating pigments are available, and is inherently rather slow in cycle time in that each pigment layer of the four-color proof must be separately and successively laminated, exposed and developed.

Another commercially available pre-press color proofing system is marketed by the DuPont Company, under the trademmark "Cromalin." In the Cromalin color proof system, dry pigment toners are factory "calibrated" to printing ink colors and each primary and black color reproduction is on a separate sheet of photopolymer film, the films after exposure and developement being laminated together in registry to provide the color proof. The cycle time for this system is said to be "within an hour", rather than the hours or days required for press proofing.

Another known pre-press color proofing system which is commercially available is the Kodak Polytrans Colour Proofing Film System, such as described in "The Reproduction of Color", by R. W. G. Hunt, at page 546 (published by Fountain Press of Hertfordshire, England, Third Edition, 1975). In the Polytrans systems screened color separation films are proofed by materials including films consisting of color-pigmented photopolymer matrices coated on a transparent film base. Exposure to blue or ultraviolet light hardens the photopolymer so that exposure thereof to the screened separations results in an image-wise pattern of the hardened polymer being obtained. Each exposed film is mounted on a suitable roller and rolled under heat and pressure onto a sheet of paper, the unhardened polymer transferring to the paper and taking the pigment with it. Four different colors of film are used and, by exposing each to the corresponding color separation positive, image-wise transfers can be obtained in each color. Each image is developed and transferred in succession, onto the paper, in register, with a color proof resulting after exposure of the transferred pigments to light. While the Polytrans system results in a color proof on a single sheet of paper, the color-pigmented photopolymer matrices used are necessarily precalibrated to printer's inks at the factory, and each color is separately and successively developed on the color proof. Registry of the respective color images on the paper can also prove to be a problem because the color images are applied to the paper by successive roller transfer.

BRIEF SUMMARY OF THE INVENTION

In general, the present invention involves the method of obtaining or reproducing one or more target colors directly on photographic media or the like by comparing a target color to a color reference diagram or like data base characteristic of a given illuminant source to select a set of color filter elements; determining the exposure times to use with each of the selected color filter elements for each target color; exposing the photographic media to the given illuminant source through the selected color filter elements for their respective exposure times; and then developing the exposed photographic media.

Further aspects of the present invention involve preparation of a color reference data base as by selecting a plurality of points located on a working diagram by use of a grid superimposed thereon; photographically preparing a colored swatch for each point so selected; and relating each colored swatch to its respective data point.

Other aspects of the present invention specify that the exposure times to use with each of the color filters per target color, for a particular photographic media used, equals each filter's respective saturation time multiplied by its respective filter percentage. After the red, green and blue components of each of the filters are identified, each filter's respective filter percentage is determined such that the sum of the red, green and blue contributions of the three color filters equal, respectively, the red, green and blue components of the target color.

The red, green and blue components of each target color are determined for positive photographic media by comparing the target color to the color reference data base and noting thereon the point or reference color whose color most closely matches that of the target color. When negative photographic media is used, a further step is required which comprises finding the data base coordinates of the color which is the complement of a target color. Then, the red, green and blue components of the color needed to produce a target color are determined for negative photographic media by utilizing the coordinates, or data base equivalent thereof, of the complement of the target color.

A further aspect of the present invention specifies a further procedure to be followed when a target color is a tint or tone of the most closely matching color in the color reference data base.

The principal object of the present invention is to provide a method for photographically reproducing target colors, using either positive of negative photographic (i.e. photosensitive) color media.

A further object of the present invention is to provide a method whereby a given target color may be produced with any illuminant source no matter what the color temperature of the illuminant source may be.

Another object of the present invention is to provide a method whereby once a particular target color is synthesized, it may be repeatedly reproduced.

It is a further object of the present invention to provide a method for substantially duplicating any given color directly by the controlled exposure of photographic media to colored illuminations from an illuminant source through a set of color filter elements.

Another object of the present invention is to provide a relatively simple, inexpensive method of synthesizing one or more target colors by sequentially exposing a photographic media to light of different colors which is extracted from an illuminant source by color filters and which is applied to selected portions of the photographic media, as by sequential exposure through a set of color separation films.

A further object of the present invention is to provide a method whereby a color reference data presentation may be produced photographically.

Another object of the present invention is to provide a method whereby, once a color reference data base is produced, variations caused by changes in the properties of the photographic media being used may be compensated for without reconstruction of the data base.

Further objects and features of the present invention involve the preparation and use of a color reference data base for accurate color reproduction of one or more target colors on photographic print media by use of an illuminant source and sets of color filters, which data include and interrelate (1) the chromaticity coordinates, dominant wavelength, and saturation percentages for each possible target color in relation to the given illuminant source, and (2) the chromaticity coordinates and filter percentatge characteristic of each filter for each target color in relation to the illuminant source. Optionally, the data can also include, or can in part be expressed in terms of target color densities, i.e. the gray level and the proportionate levels of red, yellow and blue in each target color.

Yet another object of the present invention is the development and utilization for target color reproduction of a color reference data base characteristically having, as given inputs, the temperature and spectral distribution of a given illuminant source, the color component makeup and filter percentages of the various color filter elements available, and having as variable inputs, the color component makeup or color component densities and gray level (lightness) of a given target color to be reproduced, and the color component makeup (emulsion constituency) and saturation time of the color photosensitive photographic media on which the target color is to be reproduced, the data base being programmed to provide, with reference to the given illuminant source and given photographic media, and with reference to the given target color presented, an identification of a group of one or more color filter elements usable for the target color reproduction, and in indication of the respective color filter element exposure times to be used to reproduce the given target color on the given photographic media when developed.

As applied to the art of pre-press color proofing, it is an object and feature of the present invention to provide a method whereby a pre-press color proof may be rapidly, economically and accurately prepared on a single sheet of opaque photographic paper or the like to show what the color reproduction will be like when printed using a given set of printer's inks and plates prepared from a given set of color separation components, the color proofing technique of the present invention offering the unique advantage of directly utilizing sample swatches of the actual printer's inks as target colors in the process and requiring only a single step of photographic media development rather than separate development steps for each color, as is characteristic of prior art pre-press proofing systems.

These and other objects, features, advantages and characteristics of the method of the present invention will be apparent from the following detailed description of the preferred embodiments thereof in which reference is made to the accompanying figures.

DESCRIPTION OF THE PREFERRED EMBODIMENTS

TARGET COLOR REPRODUCTION

In order properly to understand and carry out the method of the present invention as diagrammed in FIG. 2, and shown in FIG. 3, a brief overview of the method is set forth below, along with a discussion of the method's underlying principles.

Preliminarily, for purposes of the present invention, it is assumed that every color visible to the human eye is composed entirely of red, green and/or blue primary color components. Thus, it follows that any such color may be synthesized by the proper additive mixing of red, green and blue illumination. However, the problem of producing a selected target color is, first, to determine the constituent proportions of the specific red, green and blue components of the target color; and, second, to select and use color filters which will extract the proper amounts of red, green and blue light from a given illuminant source to reproduce the target color on the particular photographic media being used.

Figure 1:
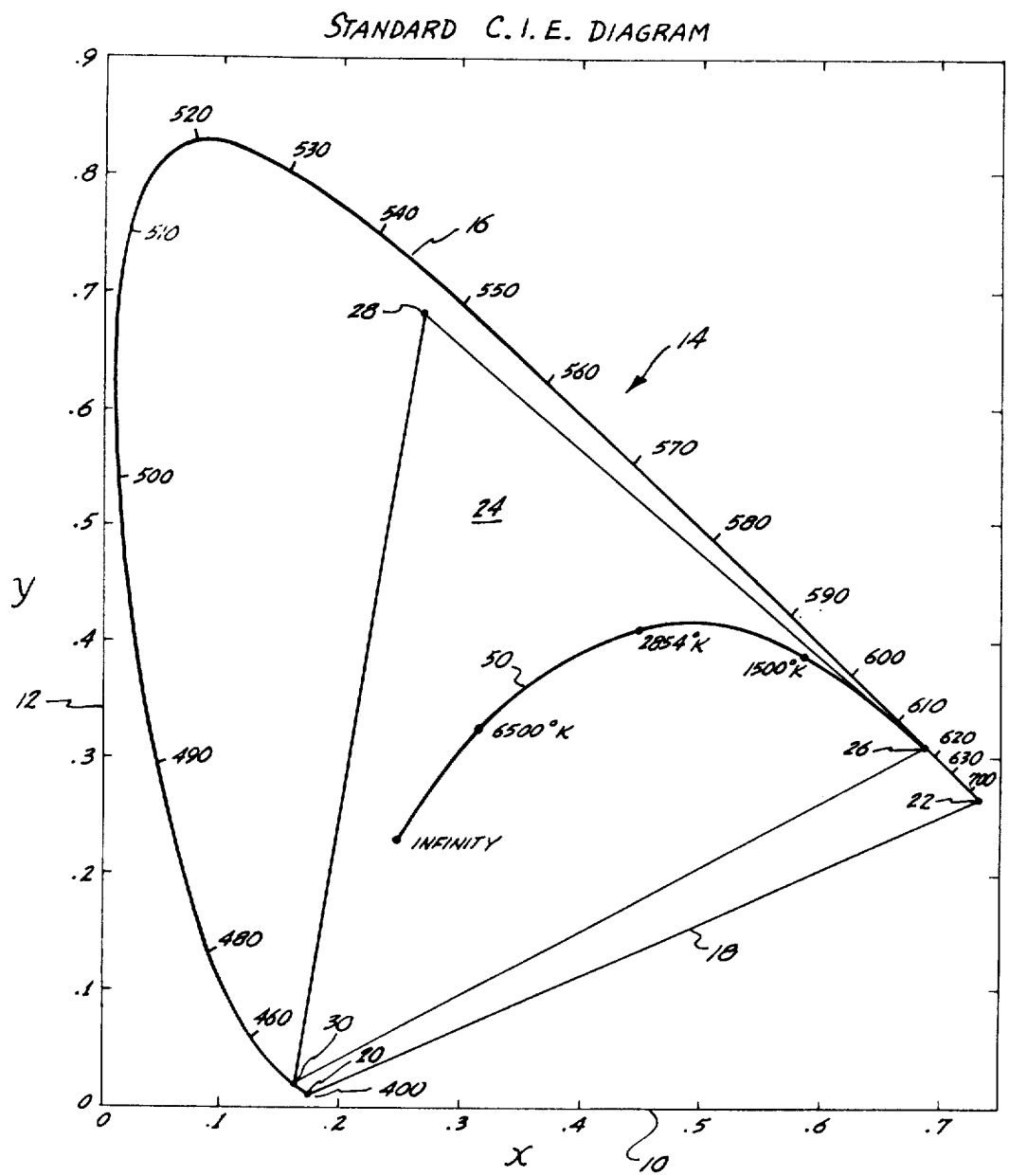
FIG. 1 is a pictorial representation of a standard CIE diagram.
Figure 3:
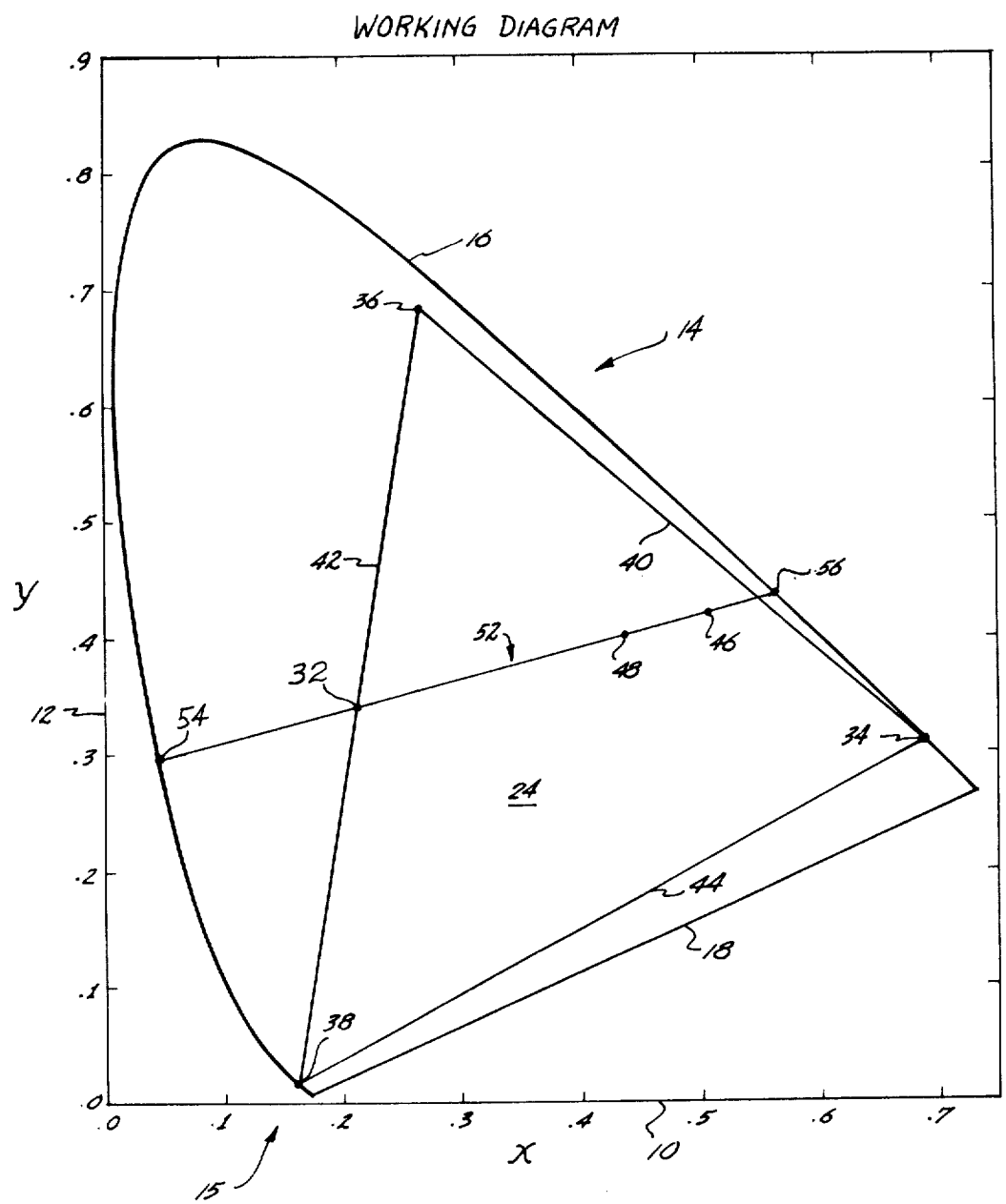
FIG. 3 is a pictorial representation illustrating the use of a data base working diagram in the present invention.

A useful analytical tool or aid for solving the aforementioned problems in accordance with the method of the present invention resides in constructing a working diagram such as depicted in FIG. 3. The working diagram of FIG. 3 is based, in part, upon the basic chromaticity diagram depicted in FIG. 1. Specifically, the chromaticity diagram of FIG. 1 is based upon a color organizing scheme or system developed by the Commission Internal de L'Eclairage, or the International Commission on Illumination (referred to as "CIE"). As shown in FIG. 1, color as described in the CIE system may be plotted graphically in a plane Cartesian coordinate system wherein the x values are plotted horizontally on the abscissa 10, and the y values are plotted vertically onthe ordinate 12. The results of such a plot is the standard CIE 1931 chromaticity diagram, generally designated at 14, showing a horseshoe shaped spectrum locus on which the points representing the chromaticities of the spectrum colors are plotted according to their wavelengths in nanometers. A straight line 18, upon which the purples and magentas are plotted, forms the base of the chromaticity diagram and connects the lower ends 20, 22 of the spectrum locus. The standard CIE diagram 14 may be obtained from recognized works on the subject such as the *Handbook of Colorimetry* by A. C. Hardy, published in 1936 by the Massachusetts Institute of Technology.

FIG. 1 also depicts a color filter triangle 24 plotted on the CIE diagram 14 which has the primary reproduction colors plotted at its vertices 26, 28 and 30. The color triangle 24 delineates the area on the CIE diagram within which a desired color may be reproduced by the additive mixture of a suitable ratio of intensities of the primary reproduction colors 26, 28, 30.

FIG. 1 additionally depicts the locus 50 of black body light sources which may be obtained from any standard reference work on the subject, such as *The Science of Color*, published by the Optical Society of America, and provides the coordinates of an ideal, black body radiant source for all possible temperatures.

It is to be understood that the working diagram 15 of FIG. 3 need not necessarily include the CIE diagram 14, except possibly for certain steps explained subsequently, but may instead be any Cartesian coordinate system or equivalent data bae, such as a computer program, having units which can be correlated with those used in a standard CIE diagram. For example, a known data system involving programming a digital computer to determine CIE coordinates from spectrophotometric data is disclosed by J. E. McCarley et al. in an article entitles "Digital System for Converting Spectrophotometric Data to CIE Coordinates, Dominant Wavelength and Excitation Purity," at 55 Journal Of The Optical Society of America, pp 355–360 (April, 1965). Other data systems known per se may also be used without departing from the scope of the present invention.

Figure 2:
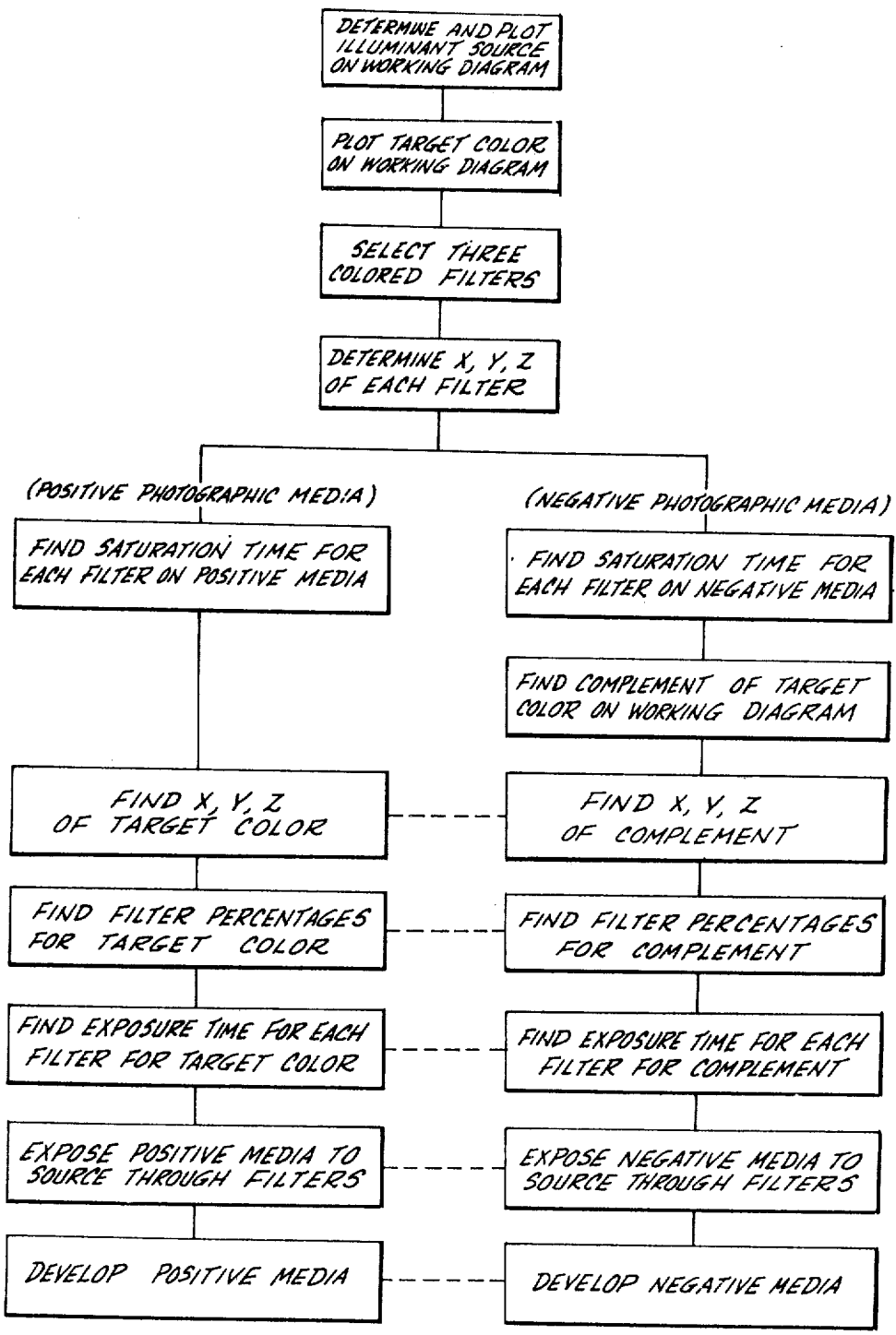
FIG. 2 is a block diagram outlining one of the methods of the present invention.

The starting point for the present method, as shown in FIG. 2, is first to determine the Kelvin temperature of the illuminant source which will be used to reproduce the target color on a selected photographic medium. Having determined the color temperature of the illuminant source, its color coordinates may be obtained from the locus 50 of black body light sources on FIG. 1. The illuminant source may then be located on the working diagram 15 (FIG. 3). For example, this point is useful in determining such information as the dominant wavelength of the target color and the complement of the target color. At this time, the spectral distribution of the illuminant source may also be determined, as by reference to its manufacturer's specifications.

Next, the color coordinates of the target color are determined by comparing the target color to a color reference data base which was prepared with a light source having the same or equivalent temperature and spectral distribution as the light source being used to reproduce the target color. The location of the closest matching color on the data base, e.g. the coordinates of the matching color or reference color on the color reference data base, is taken to be that of the target color. These coordinates are then used to plot the target color 32 on the working diagram 15, shown in FIG. 3.

Then, a set of three filters 34, 36, 38 is selected which is usable to reproduce the particular target color 32. In order to determine whether a given set of color filters can be used to achieve a particular target color, all of the color filters being considered must first be located on the data base. As has been explained, since the location of each filter depends upon the Kelvin temperature and the spectral distribution of the illuminant source used, the data point chosen for each filter must be that determined for an illuninant source having a Kelvin temperature and a spectral distribution which is the same as or equivalent to that used to produce the target color.

Filter triangle plots, or data base equivalents thereof, are then delineated and any set of color filters may be used which defines a filter triangle or equivalent coincident with or encompassing the location of the target color. This is because, when considering photographic media, a set of color filters may be used to produce any color located within or on the filter triangle they define. It is to be understood that if none of the filter triangles satisfies this requirement, additional or different filters are necessary in order to reproduce the target color on the photographic media.

In order to determine the constituent color components of the target color 32 and each of the color filters 34, 36, 38 the same working area 15 upon which the target color and the three color filters have been plotted can be used. For the purposes of the present invention, the x coordinate of the plotted point for the target color 32 and for each filter 34, 36, 38 is taken to represent its red component, and its y coordinate is taken to represent its green component. Since any color is understood to equal the sum of its red, green and blue components, it follows that each color's blue component, which is designated as z, may be calculated according to the equation: $z = 1 - (x+y)$. Accordingly, once the position of the target color 32 and each of the color filters 34, 36, 38 is known on the working diagram, the quantity of their red and green components may be read directly from the working diagram, while their blue components may be easily computed by the use of the formula given. Using this procedure, the x, y, z coordinates of each color filter are determined, which represent, of course, their red, green, and blue components, respectively.

At this point it should be noted that, as seen in FIG. 2, somewhat different procedures are used depending on whether positive or negative photographic media are to be utilized to produce the target color. The method for positive photographic media is next discussed below.

Since the goal is to reproduce the target color photographically, and not by matching a colored lights on a screen as were used to produce a standard CIE diagram, it is necessary to determine the exposure time needed for each of the three color filters being used. This is done by first determining the saturation time for each color filter 34, 36, 38 for the particular positive photographic media being utilized. Briefly, this may be accomplished for each color filtter by making a series of successively longer exposures through the filter onto the photographic media, until lengthening the exposure time produces no observable change in the color found in the developed media. The first exposure time which achieves this result is considered to be the saturation time for that particular color filter.

Next, as seen in FIG. 2, the red, green and blue components of the target color are obtained by means of the previously described procedure which starts with noting the target color's x, y coordinates on the working diagram and then using the formula $z = 1 - (x + y)$ to compute its blue component.

Once the red, green and blue components of the target color and of each of the three color filters are known, it is then necessary to determine how much of each color filter is needed in order to reproduce the target color. This is done by determining what percentage of each color filter is needed to achieve a result such that the sums of their red, green and blue contributions equal, respectively, the red, green and blue components of the target color. The filter percentage needed for each color filter may be computed in the manner described in the example hereinafter set forth utilizing conventional mathematical techniques, e.g., the interative numerical method described in, for example, Billmeyer, Fred W. et al., *Principles of Color Technology*, John Wiley & Sons, (p. 120) (1966).

Having obtained the filter percentage needed for each color filter, each filter's exposure time is obtained by multiplying its respective saturation time by its respective filter percentage. Finally, the particular, positive photographic media being used is exposed sequentially to the illuminant source through each color filter for its respective exposure time. Upon developing the photographic media in accordance with the manufacturer's instructions, the target color is produced on the developed positive photographic media.

It should be again noted that the method just described for positive photographic media is altered somewhat to make it suitable for use with negative photographic media, which is the media preferred by most of those skilled in the photographic art. However, as seen in FIG. 2, both methods have many steps which are similar and these steps have been connected by dotted lines. One of the similar steps is the determination of the saturation time for each of the color filters on the particular negative photographic media being used. This step is performed analogously to the step heretofore described for determining the saturation time for each of the color filters on positive photographic media.

However, the differences in the methods, which are seen in FIG. 2, may be accounted for by the fact that, as is known, when negative photographic media is exposed to light of a color that is the same as the target color, the target color will not result when the negative photographic media is developed. Instead, a color will result which approximates the complement of the target color. Another possibility is that of obtaining a given target color by exposing negative photographic media to light whose color is the complement of the target color. In a procedure which is described in more detail subsequently, the location on the working diagram for the complementary color 46 is found through use of the plotted point for the color 32, the plotted point for the illuminant source 48, and the CIE diagram 14.

Once the location of a complement of the target color has been found on the working diagram, the remaining steps in the procedure for negative photographic media set out in FIG. 2 are performed analogously to the similar steps set out in the procedure for positive photographic media. The only difference is that the "working color" in the method for positive photographic media is the target color, while in the method for negative photographic media, the "working color" is a complement of the target color. Hence, the remaining steps of the procedure set forth for negative photogaphic media need not be described further since the similar steps are performed analogously.

It will be apparent that the sequence of steps shown in FIG. 2 need not be performed in exactly the sequence given. For example, in the method shown for positive photographic media, the coordinates of the target color can be found any time after the target color has been plotted on the working diagram, but before the filter percentages are found. Similarly, the saturation time for each filter can be found any time after the three color filters have been selected, but before their exposure times are determined. In the same vein, the filter percentages can be found any time after the coordinates of the three filters and the target color are known, but before the exposure times are found. Analogous comments apply to the method shown in FIG. 2 for negative photographic media. Other workable sequences of steps will be apprent to those skilled in the art from the foregoing description, and from the more detailed description of the methods of the present invention which follows.

To further illustrate the significant features of the method of the present invention set forth in FIG. 2, the following detailed examples are presented.

EXAMPLES OF TARGET COLOR REPRODUCTION

A. On Positive Photographic Media

A swatch of bluish color was chosen to be the color for reproduction, i.e. as the target color 32. However, any color visible to the human eye could have been selected.

Then, through the use of a Kelvin meter, the illuminant source was found to have a color temperature of approximately 3050° Kelvin. By using the locus of black body light sources 50, shown in FIG. 1, it was possible to determine the illuminant source's x, y coordinates for plotting on the working diagram 15. The x, y coordinates of the illuminant source 48 were taken to be the same as the coordinates of the point on the locus 50 having the same color temperature as the illuminant source 48 used. Since its temperature was determined to be 3050° Kelvin, the illuminant source 48 had the coordinates x = 0.4334, y = 0.4028.

Next a color reference data base in the form of a CIE diagram was obtained, or was produced according to the more detailed description which follows, with an illuminant source of a color temperature and a spectral distribution the same as that of the illuminant source being used to prepare the target color. Then, the target color was compared to the color reference diagram and it was noted that the x, y coordinates of the closest matching color thereon were x(red)=0.2110 and y(green)=0.3425. Using these coordinates, a point for the target color 32 was plotted on a working diagram 15 as shown in FIG. 3.

In the example being discussed, three color filters 34, 36, 38 were selected to be plotted on the working diagram 15. Preferably, the color filter elements used should have excellent optical quality so that they will not diffuse the light transmitted therethrough, and should be of uniform color throughout to avoid color variations in the results produced. Since dyes used to produce precision color filters gradually change color with age, it is preferred that the selected filter elements be as color stable as possible. Filters found to be particularly suitable are produced by the Eastman Kodak Company and are identified in the trade as being Kodak Wratten Photomechanical Filters. In this example, the filters chosen were the Kodak Wratten Photomechanical filters numbered 25 (red), 58 (green) and 47B (blue), and have been designated as filters 34, 36, 38, respectively.

In order to plot the filters on the working diagram, it is necessary to determine their x, y coordinates or the data point equivalents thereof. This may be done either by referring to the manufacturer's reference data, or by use of a spectrophotometer, or by direct comparison of the color filters to the color reference diagram to find the coordinates of the closest matching color thereon, for example.

When a filter's coordinates are found by comparison with the color reference diagram, the filter should, of course, be illuminated by an illuminant source whose color temperature and spectral distribution are the same as that of the illuminant source which was used to produce the target color and the color reference diagram. Similarly, when the filter's coordinates are being found by referring to the manufacturer's reference data, the coordinates listed therein must be chosen which were prepared using an illuminant source whose color temperature and spectral distribution are as close as possible to that of the illuminant source used to produce the target color and the color reference diagram.

As indicated, the illuminant source 48 used in this example is a tungsten light whose color temperature was found, through the use of a Kelvin meter, to be approximately 3050° Kelvin. To find the x, y coordinates of the filters 34, 36, 38, reference was then made to the booklet "Kodak Filters for Scientific and Technical Use," published by Eastman Kodak Company of Rochester, N.Y. This booklet lists the x, y coordinates of each filter produced by the Eastman Kodak Company for illuminant sources of several color temperatures. The data selected were those listed for Standard Illuminant A, as specified by the International Commission on Illumination, which is a tungsten light having a color temperature of 2856° Kelvin. Since the color temperature differed by only 194° Kelvin, a fairly close match was found for the illuminant source being used. Of course, more accurate results can be obtained through interpolation of the reference data supplied by the manufacturer.

The three filters were then plotted on the working diagram shown in FIG. 3 using the following coordinates which were supplied by the manufacturer for Standard Illuminant A:

| Filter | x (red) | y (green) | z (blue) |
| --- | --- | --- | --- |
| 25 (red) | .6850 | .3147 | .0003 |
| 58 (green) | .2693 | .6831 | .0476 |
| 47B (blue) | .1554 | .0220 | .8226 |

The z coordinates were, of course, obtained through the use of the formula $z = 1 - (x + y)$.

After the filters were plotted, straight lines 40, 42, 44 were drawn interconnecting plot points for the red and green filters, the green and blue filters, and the blue and red filters, respectively, to form a filter triangle 24, as seen in FIG. 3. It was observed that the target color plot point lay within this filter triangle and thus these three filters are suitable ones to use to produce the target color.

As has been noted, the method of FIG. 2 when used to produce the target color on positive photographic media, differs somewhat from that used to produce the target color on negative photographic media. Each method is therefore described separately below, with the method for positive photographic media being addressed first.

First, the saturation time for each color filter was determined for the particular, positive photographic paper being used, Kodak Ektachrome R.C. paper type 1993, manufactured by Eastman Kodak Company. In this step also, it is important that the color temperature and spectral distribution of the illuminant source used to obtain the saturation time of the paper be the same as that used to produce both the color reference diagram and the target color.

One way of determining each filter's saturation time is to make a series of sequential exposures of lengthening time through the filter onto the photographic media being used, and when no further change in color is observed in the developed paper, the first exposure time to produce that color is the saturation time for that filter. Accurate checks on the saturation time are made by making successive exposures with only a small increase in exposure time and by checking the change in color found in the developed paper as by use of a densitometer. In the example selected, the saturation times for the red, green and blue filters were found to be, respectively, 35.3 seconds, 37 seconds and 20.1 seconds.

After the saturation times were determined, the x, y coordinates of the target color were noted from the working diagram to be x(red)=0.211 and y(green)=0.3425. The blue coordinate was found to be $z = 0.4465$ using the formula $z = 1 = (x + y)$.

Next, the filter percentages for the red, green and blue filters, in relation to the target color were found to be 0%, 48.1%, 51.9%, respectively. These filter percentages (the proportionate filter exposures necessary to essentially reproduce the target color from the filter colors) are obtained by interpolatively correlating the target color coordinates and the filter color coordinates. Thus, for example, the dominant filter 47B (blue) can be expected to provide the dominant target color component (z coordinate 0.4465) and will approximately do so at a filter percentage of 52% (0.4465−0.4278=0.0187 error). Similarly, the second significant color coordinate of the target color (y coordinate 0.3425) is provided primarily by the filter 58 (green) which is will approximate at a filter percentage of 48%, taking into account the y component (green) contribution (0.0114) of the 47B filter (blue) (0.3425−0.0114−0.3279=0.0032 error). Filter 58 (green) also substantially provides the third target color components (x coordinate 0.2110) at the same filter percentage providing a red color component contribution of 0.1293 along with the x (red) color component contribution (0.0808) of the 47B filter (0.2110−0.0808=0.0009 error), and making a z component (blue contribution (0.0228) thereby reducing the blue error in the 47B and 58 filter contributions (0.0187−0.0228=0.0041 error). Refinement of the interpolations result in the indicated respective filter percentages for the selected filters, in relation to the selected target color, of 0% for the 25 filter (red), 48.1% for the 58 filter (green), and 51.9% for the 47B filter (blue).

The foregoing calculations for obtaining the requisite filter percentages are illustrated by reference to the following tables wherein Table I sets forth the color filter coordinates for the indicated filter elements at the indicated filter percentages, and Table II sets forth an interative numerical method for obtaining the final filter percentage values.

be expressed as a percentage) of the individual color components required for obtaining a specific color such as, for example, a target color. For instance, in the above example, the target color is constituted of 21.2% of the red component (x), 34.25% of the green component (y) and 44.65% of the blue component (z). Also, the foregoing quantities of the color components indicate that the target color in this instance can be reproduced by use of only two color filter elements, namely, the green filter (Filter No. 58) and the blue filter (Filter No. 47-B), since all of the requisite amounts of the color components of the target color can be provied by these two filters. In this regard, it is noted that each filter element contains a quantity of each of the red, green and blue color components. Thus, for this example, the red filter (Filter No. 25) need not be used to reproduce the target color. Likewise, the color contribution from the blue filter element is the largest required of any color filter element in order to reproduce the target color.

Step 2 of Table II indicates the amount of the color components contributed by Filter No. 47-B (blue) at a filter percentage of 50%. Any value of filter percentage

TABLE I

| Filter | Color Filter Coordinates | | | | | | | | |
|---|---|---|---|---|---|---|---|---|---|
| | Filter No. 25 (red) | | | Filter No. 58 (green) | | | Filter No. 47-B (blue) | | |
| % | x | y | z | x | y | z | x | y | z |
| 100 | 0.6850 | 0.3147 | 0.0003 | 0.2693 | 0.6831 | 0.0476 | 0.1554 | 0.0220 | 0.8226 |
| 90 | | | | | | | | | |
| 80 | | | | | | | | | |
| 70 | | | | | | | | | |
| 60 | | | | | | | | | |
| 50 | | | | 0.1346 | 0.3415 | 0.0238 | 0.0778 | 0.0110 | 0.4113 |
| 40 | | | | | | | | | |
| 30 | | | | | | | | | |
| 20 | | | | | | | | | |
| 10 | | | | | | | | | |
| 5 | | | | | | | | | |
| 4 | | | | | | | | | |
| 3 | | | | | | | | | |
| 2 | | | | 0.0053 | 0.0136 | 0.0009 | 0.0031 | 0.0004 | 0.0164 |
| 1 | | | | 0.0026 | 0.0068 | 0.0004 | 0.0015 | 0.0002 | 0.0082 |
| 0.5 | | | | 0.0013 | 0.0034 | 0.0002 | 0.0007 | 0.0001 | 0.0041 |

TABLE II

| | | Filter Percentage Calculation | | | |
|---|---|---|---|---|---|
| Step | Filter No. | Filter % | Color Coordinates | | |
| | | | x | y | z |
| 1 | — | — | 0.2110 | 0.3425 | 0.4465 |
| 2 | 47-B | +50% | +0.0777 | +0.0110 | +0.4113 |
| | | | Δ−0.1333 | Δ−0.3315 | Δ−0.0352 |
| 3 | 58 | +50% | +0.1346 | +0.3415 | +0.0238 |
| | | | Δ+0.0013 | Δ+0.0100 | Δ−0.0114 |
| 4 | 58 | −2% | −0.0053 | −0.0136 | −0.0009 |
| | | | Δ−0.0040 | Δ−0.0036 | Δ−0.0123 |
| 5 | 47-B | +2% | +0.0031 | +0.0004 | +0.0164 |
| | | | Δ−0.0009 | Δ−0.0032 | Δ+0.0041 |
| 6 | 47-B | −½% | −0.0007 | −0.0001 | −0.0041 |
| | | | Δ−0.0016 | Δ−0.0033 | Δ0 |
| 7 | 58 | +½% | +0.0013 | +0.0034 | +0.0002 |
| | | | Δ−0.0003 | Δ+0.0001 | Δ+0.0002 |

| Summary of Filter Percentages | |
|---|---|
| Filter No. 47-B: | +50% + 2% − ½% = 51.5% |
| Filter No. 58: | +50% + 2% + ½% = 48.5% |

In the above calculations, Step 1 represents the color coordinates of the target color. Incidentally, the color coordinates represent the fractional quantity (and may may be selected initially to begin the computation process, and in this instance the 50% value represented an approximation of the largest contribution of the blue color component as would be required for achieving the target color. The difference (Δ) between the target color goal and that contributed by Filter No. 47-B indicates, in this instance, a deficit (−) in the quantity of each color component necessary for achieving the target color gel.

Step 3 of Table II indicates the amount of the color components contributed by Filter No. 58 (green) at a filter percentage of 50%. The difference (Δ) obtained by adding the amounts of each color component of Step 3 to each respective Δ-value from Step 2 results in a new Δ-value for each color component. The Δ-values from Step 3 indicate a slight excess of both the red and green components and a slight deficiency in the blue component.

Step 4 of Table II indicates the reduction in the amount of each color component that would be achieved by a 2% reduction from Filter No. 58 (green). The newly calculated Δ-values in Step 4 indicate a slight deficiency in each color component.

Step 5, 6 and 7 indicate the contribution or reduction in color obtained from a 2% contribution and a 0.5% reduction from Filter No. 47-B (blue) and a 0.5% contribution of color from Filter No. 58 (green).

The above calculations are preferably continued until Δ-values of about zero are obtained, and then computing the net filter percentage of each filter element necessary for reproducing a target color.

By multiplying the red, green and blue filters' respective filter percentages by their respective saturation times, the desired exposure times for the respective filters were found to be 0 seconds, 17.8 seconds, and 10.4 seconds, respectively.

The last steps involve sequentially exposing the photographic paper to the illuminant source through each of the up to three color filters for its respective saturation time. After the last exposure is made, the positive photographic media is developed in accordance with the manufacturer's instructions, with the result that the target color is substantially reproduced on the developed positive photographic paper.

The foregoing discussion illustrates the procedure employed in the process or method of the present invention for achieving reproduction of a target color such as, for example, target color 32. The reproduction of a target color depends upon many variables including the operability and functionality of the color photographic media and the color filter elements that are utilized. For instance, while it may not be possible to actually duplicate a target color that is located on the very edge of a color filter triangle, it is possible, within the operable limits of the color photographic media, to substantially reproduce such a color on the same dominant wavelength located just a short distance inside the color filter triangle.

TARGET COLOR REPRODUCTION FOR SPECIFIC GRAY LEVELS OF CHROMATICITY DIAGRAM

In accordance with the process of the present invention, it is desirable to determine the proper "lightness," i.e., brightness, of the target color in order to achieve accurate reproduction of the target color. Specifically, the additive color mixing concept which forms the basis of the CIE color-order system requires the specification of three color coordinates, namely, x, y and Y, to properly and completely describe a target color. The Y coordinate, when plotted on the CIE diagram of FIG. 1, extends perpendicularly to the x-y plane and represents the lightness axis. The "lightness" quality of color is sometimes referred to as "brightness" and can be related to a gray color of similar lightness. For instance, the Y-axis that is perpendicular to illuminant source 48 in the working diagram of FIG. 3 is characterized by a gradation or achromatic scale ranging from white through gray to black. Thus, the Y-axis presents an order or degree of "lightness," and it is preferable to determine the level of a target color on the Y-scale or axis (referred to hereinafter as the "gray level") in order properly to reproduce that color. Levels on the Y-scale or axis either above or below that of the target color represent a tint or a tone of the target color, respectively.

Thus, a technique important to practical target color reproduction according to the present invention involves the determination of saturation time for a particular gray level. The determination may be made as follows. A trial exposure is made for a gray sample, using any combination of up to three filters, but the filter combination should be such as to produce a color balance of ⅓ each of cyan, megenta and yellow. The exposed sample is then measured with a densitometer or like instrument (spectrophotometer or colorimeter) that identifies balance of cyan, magneta and yellow, i.e., the grayness of the sample. In the case where a densitometer is used for this measurement, four readouts are given by the instrument. As an example, the gray level of the sample may be 70.0 and the color densities may be cyan 65.0, magenta 72.0 and yellow 59.0. By adding these three densities, a total of 196.0 results. The density balance in the selected example is 33% for cyan (65/196×100), 37% for magenta (72/196×100) and 30% for yellow (59/196×100). A color balance of 33% for each of the cyan, magenta and yellow is necessary to achieve a neutral gray color. In the instance of this example, these colors were obtained through the complementary filters Wratten 25, 58 and 47-B, for cyan, magenta and yellow. Subtracting the percent difference for each color, it is noted that cyan at 33% requires no correction, the magenta requires a reduction of −4% and yellow requires an increase of 30 4%. At this point correction factors are employed to make a new exposure. Since color density and exposure time are related logarithmically, the correction factor is 0.9120 to reduce the magenta density by 4%. Therefore, the original exposure time is multiplied by 0.9120 to give the new time for the magenta exposure. Correspondingly, yellow is 3% under so the correction factor in this instance would be 1.072 to give the new exposure time for yellow. The density correction factors can be obtained from the table on pages 19-20 of *Natural Color Processes*, Dunn, Carlton E., American Photographic Publishign Company, Boston (1940).

The following table illustrates the steps of the foregoing computational technique:

1. Experimentally Determined Filter Exposure Times for Target Gray
   10.1 sec. for the 25 filter (for cyan)
   4.2 sec. for the 58 filter (for magenta)
   2.4 sec. for the 47-B filter (for yellow)
2. Densitometer Measurement of Resulting Exposed Sample (Using Exposure Times from 1 above)
   70) 65 72 59
3. Density Balance     Cyan    Magenta   Yellow
   65 + 72 + 59 = 196   65/196 =   72/196=   59/197 =
                                  33%       37%      30%
4. Color Density Variation for Achieving Neutral Gray
       Cyan      Magenta     Yellow
   NEED 33%   NEED 33%   NEED 33%
   HAVE 33%   HAVE 37%   HAVE 30%
       0           +4%        −3%
5. Correction Factor
   Cyan − 0   Magenta − 0.9120   Yellow − 1.072
6. New Exposure Times
   Cyan        Magenta             Yellow
   10.1 sec.   4.2 × 0.9120 = 3.8 sec.    2.4 × 1.072 = 2.6 sec.

One of the advantages of the method of the present invention is that once the saturation times for particular color filters are known in relation to an illuminant source of a certain Kelvin temperature, variations in the color density of the paper or in the color guide numbers on different boxes of paper may be compensated for (to produce a gray) without experimentally redetermining the saturation times for the color filters.

To illustrate, if a different gray level is preferred in the above example, say 66 by way of example instead of 70, the correction figure to arrive at the preferred gray level is 0.943 (66/70), applicable to all exposure times.

Another sample is exposed, using the revised exposure times and the correction procedure is repeated if necessary until the desired gray balance and gray level are achieved. Once these exposure times are obtained, it is next desirable to find the saturation time for that level for all colors. With the correct gray exposure time at hand, the three exposure times are divided by the correct "percentage of filter" amounts for gray, as determined from the chromaticity data base for the illuminant point, as earlier discussed.

Taking the "percentage of filter" amounts for the illuminant point, these figures are divided into the new times for gray and this determines the saturation times at this particular level of the chromaticity diagram for all colors. Using this time, any color reproduction can be achieved by using new exposure times obtained by multiplying the "percentage of filter" amount by the saturation time.

The following table illustrates the foregoing technique (using the example initially discussed earlier):

---
1. Correction Factor for Changing Gray Level
    NEED 66 gray level
    HAVE 70 gray level Factor = 66/70 = .943
2. New Exposure Times for New Gray Level
    10.1         3.8          2.6
    ×.943        ×.943        ×.943
    9.5 sec.     3.6 sec.     2.4 sec.
---

3. Assuming the these exposure times for gray are correct, the following SATURATION TIMES FOR the 66 gray level of the chromaticity diagram evolve, using the given photographic media used in the example:

---
9.5/.443* = 21.4 sec.        3.6/380* = 9.5 sec.
2.4/.177* = 13.6 sec.

*Filter percentages for illuminant point - from The Science of Color, (supra).
---

Any color on this gray level may now be exposed for, using these filter saturation times.

In summary, the foregoing procedures may be utilized for achieving target color reproduction in the following manner. After the saturation times have been determined for each filter, a final check on the accuracy of the result can be made by trial production of a gray at the plotted point for the illuminant source 48 (FIG. 3). This can be done by employing the method set out in FIG. 2, and then, in this method, specifying the target color to have the coordinates of the plotted point for the illuminant source. Whether a gray has been achieved may be checked, for example, by comparing the resulting color with a standard reference work such as the True Color Process Guide, published by Krug Litho Art Co., Kansas City, Mo., or by checking the sample on a reflective digital densitometer such as a GAM Model 126P, available from the Graphic Arts Manufacturing Company. If it is found that a gray has not been achieved, the dominant color(s) are observed and the exposure times(s) for the filter(s) are adjusted in the manner discussed above until a gray is obtained.

B. On Negative Photographic Media

Turning now to an illustration of the method to be used to produce the target color on negative photographic media, it is again notable that several of its steps differ from those used in the method to produce the target color on positive photographic media. However, the substantial similarities which have been previously mentioned should be kept in mind. The negative photographic media selected for use in this example was Kodak Ektacolor 37RC, type 2290, negative photographic print paper manufactured by the Eastman Kodak Company of Rochester, N.Y.

As in the method for positive photographic media, the method for negative photographic media begins by determining the color temperature of the illuminant source and then plotting it on the working diagram. Similarly, the target color 32 was also plotted on the working diagram. Three suitable colored filters 34, 36, 38 were selected, as before, by plotting the three color filters on the working diagram, and drawing straight lines 40, 42, 44 to join them to form a filter triangle 24. It was determined, as before, that the red, green and blue filters 34, 36, 38 are suitable for use. The x, y, z coordinates of each were determined, as has been described, to be the same as set forth in the method for positive photographic media.

Next, the saturation time for each color filter was determined for the negative photographic media in a manner analogous to that previously described for positive photographic media. The results were that the red, green and blue filters 34, 36, 38 have saturation times of 38.4 second, 21.3 seconds and 28.8 seconds, respectively, on the negative photographic paper.

It will be recalled that, in order to obtain the target color on the negative photographic media, the negative photographic media is exposed to a light whose combined color is complementary to that of the target color. The coordinates or equivalent point of this complementary color 46 is to be determined in order to synthesize it using the three color filters. This can be done, for example, by using the CIE diagram 14, which is now drawn on the working diagram 15. Referring to FIG. 3, a straight line generally designed as 52 was drawn between the plotted points for the target color 32 and the illuminant source 48 as the initial step. The straight line 52 was then extended to intersect opposite sides of the CIE diagram 14 at points 54, 56.

The percentage of the distance the plotted point for the target color 32 lies on the straight line 52 between the illuminant point 48 and intersection point 54 is now determined. In the selected example, it was found that, as shown in FIG. 3, the target color lay 56% of this distance. The coordinates of the complementary color 46 of the target color 32 are then determined by proceeding along the straight line 52 from the plotted point for the illuminant source 48 towards the intersection point 56 on the far side 16 of the CIE diagram 14. The distance traveled is such that if the plotted point for the target color 32 lies 56% of the distance along the line between the plotted points for the illuminant source 48 and the near side of the filter triangle, then the complementary color 46 lies the similar percentage of the distance between the plotted point for the illuminant source 48 and the far side 40 of the filter triangle. From FIG. 3 it is shown that the coordinates corresponding to the complementary color 46 were x=0.5450, and y=0.3560. The z coordinate, calculated in the usual manner, was found to be z=0.0990.

Next, the filter percentages needed to produce the complementary color are determined in the usual manner, using the x, y, z coordinates determined for the complementary color 46, and for the three colored filters, 34, 36, 38. As a result, the red, green and blue filters 34, 36, 38 were found to have filter percentages of 58%, 36% and 6%, respectively. By multiplying each filter's respective filter percentage by its respective saturation time, each filter's exposure time needed to produce the complementary color was found to be 22.3 seconds, 7.7 seconds and 1.7 seconds, respectively.

When the negative photographic media was exposed to the illuminant source through each of the color filters for the respective exposure times, and developed in accordance with the manufacturer's instructions, it was found that the target color had been substantially reproduced on the developed paper.

Turning now to other considerations, it may be that when the target color is compared to the color reference diagram in accordance with the method set forth in FIG. 2 for both positive and negative photographic media, a close match for the target color is not found. In that case, it is apparent that the target color is either a tint (lighter than) or a tone (darker than) of the closest matching color found on the color reference diagram. It will be seen that, by using the methods that are diagrammed in FIGS. 2 and 4, any target color may be accurately produced, which is one of the significant advantages of the present invention.

Figure 4:
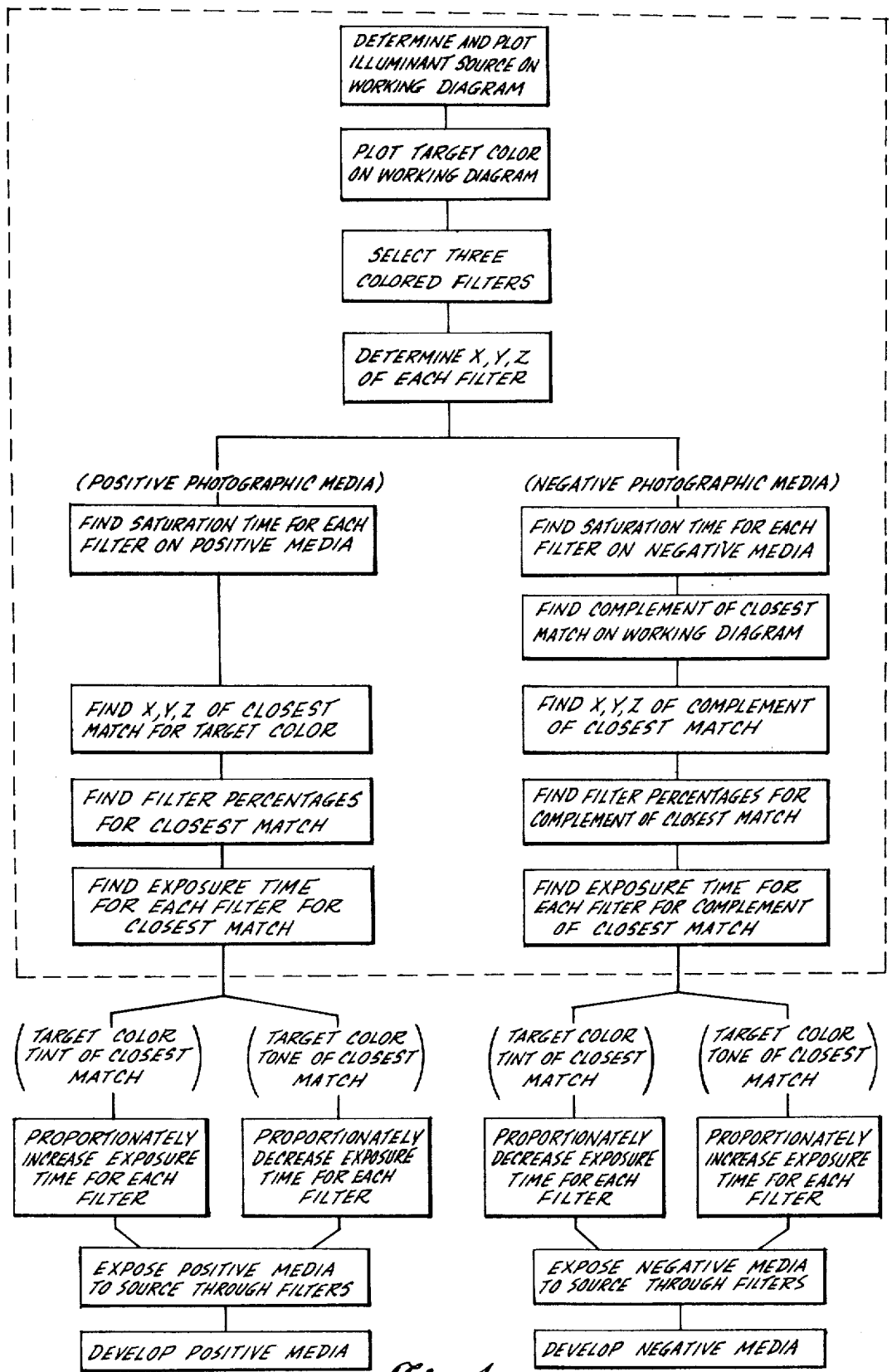
FIGS. 4 and 5 are block diagram outlines of other methods of the present invention.

However, in order to obtain accurate results when the target color is a tint or a tone of the closest matching color, it is necessary to use the method as set forth in FIG. 4 which is based on, but is a refinement of, the method of FIG. 2. In fact, it has been observed that the steps of the method set forth in FIG. 4 which are enclosed by a dotted line are directly analogous to the corresponding steps of the method set forth in FIG. 2. When using positive photographic media in the method of FIG. 4, the only difference is that, instead of determining the exposure time for each color filter for the target color, the exposure time for the closest matching color is determined. When using negative photographic media in the method set forth in FIG. 4, the only difference is that, instead of determining the exposure time for the complement of the target color, the exposure time for the complement of the closest matching color is determined.

Once the exposure time for each filter for the closest matching color or its complement is determined, different methods are needed, as shown in FIG. 4, depending on whether positive or negative photographic media is used to produce the target color.

If it is found that the target color is a tint of the closest matchin color, and if positive photographic media is used, a series of exposures are made, using as a basis the exposure time for the closest matching color. In the series of exposures, the exposure times for all of the filters are proportionally increased, resulting in a hue of lighter and lighter tint on the developed photographic media until the target color is reached. If negative photographic media is used, the exposure time for each of the filters that was found for the complement of the closest matching color is proportionately decreased and again, a series of exposures are taken. The result is a hue of a lighter and lighter tint on the developed negative photographic media until the target color is reached.

If the target color is foound to be a tone of the closest matching color, again different methods are used depending on whether positive or negative photographic media are employed, as seen in FIG. 4. In the case of use of positive photographic media, the exposure time for each of the color filters found for the closest matching color is proportionately decreased and a series of exposures is made, each with a shorter and shorter exposure time. The result in the developed positive photographic media is a hue of darker and darker tone until the target color is reached. If negative photographic media are used, the exposure time for each of the color filters found for the complement of the closest matching color is proportionately increased. A series of exposures is made, each having a longer exposure time, until the target color is finally obtained in the developed, negative photographic media.

COLOR DATA BASE PREPARATION

Since it is fundamental to the methods shown in FIGS. 2 and 4 that the target color be located on the working diagram 15, it is apparent that an accurate, detailed, color reference data base must be available against which the target color can be matched, in order to find its coordinates. At present, no color reference data base exists which fulfills the requirements necessary for the proper practice of the present invention. At best, the only existing color reference data bases consist of relatively crude painted reproductions of the colors appearing on a standard CIE diagram. The reason for the lack of an adequate color reference data bse may be that the CIE system is not associated with any particular set of physical samples. Instead, the system is based on the concept of additive color mixing as derived from experiments in which a colored light from a test lamp is shown on a white screen and is then matched by mixing three primary color lights on the screen adjacent the test light.

Figure 5:
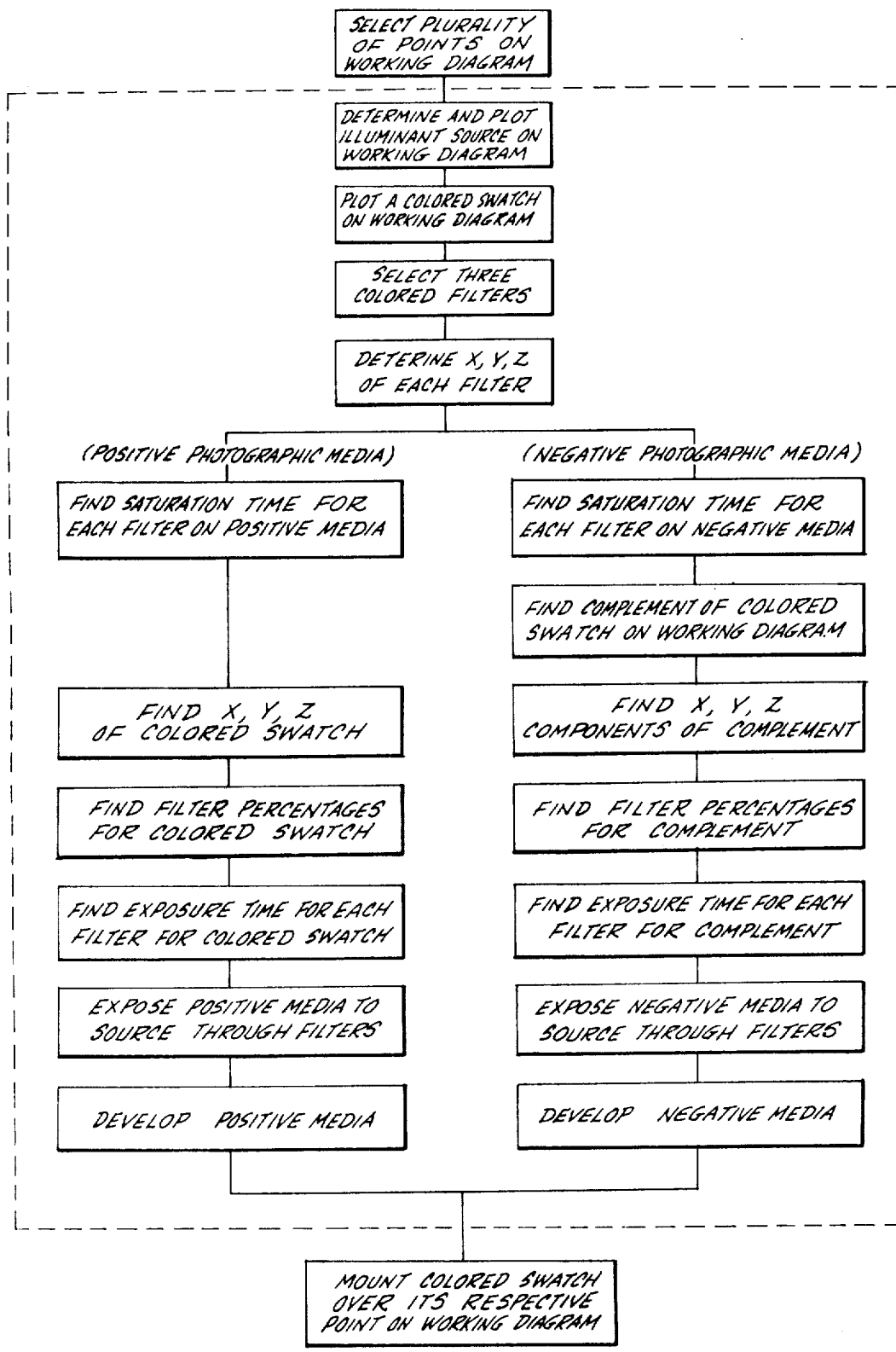

Briefly, according to the method of the present invention, a color reference data base may be prepared as by following the procedure outlined in FIG. 5, by first selecting a plurality of points located on a working diagram (FIG. 6) which again has units proportional to those appearing on a standard CIE diagram. As befor, working diagram 15 need not include the CIE diagram 14, but is preferred that the CIE diagram be included to aid in the aforesaid selection of points, since no color visible to the human eye will appear outside the CIE diagram 14. As has been explained, an illuminant source is selected whose color temperature and spectral distribution are the same as that being used to produce the target color. Then, a colored swatch 62 is prepared photographically for each point selected, and the finished color reference diagram is formed by mounting each colored swatch over its respective point on the working diagram 15. Since it is known that on a standard CIE diagram the colors merge imperceptibly into one another, one must keep in mind that the accuracy of the color reference diagram thus compiled depends upon the number of discrete sample points selected. A relatively few sample points give a relatively inaccurate result under the present method, while a relatively large number of sample points will, of course, give much better results. The number of sample points taken is thus determined by the degree of accuracy required by the user. Through the use of a large number of sample points, a color reference data base is generated which has an accuracy sufficient to meet any need of a particular user. Of course, a countervailing factor is that, as the number of sample points increases, the cost of preparing the data base also increases. Thus, some balancing must be done by the user between his need for accuracy, and the cost of preparing a color reference diagram capable of meeting that degree of accuracy.

Figure 6:
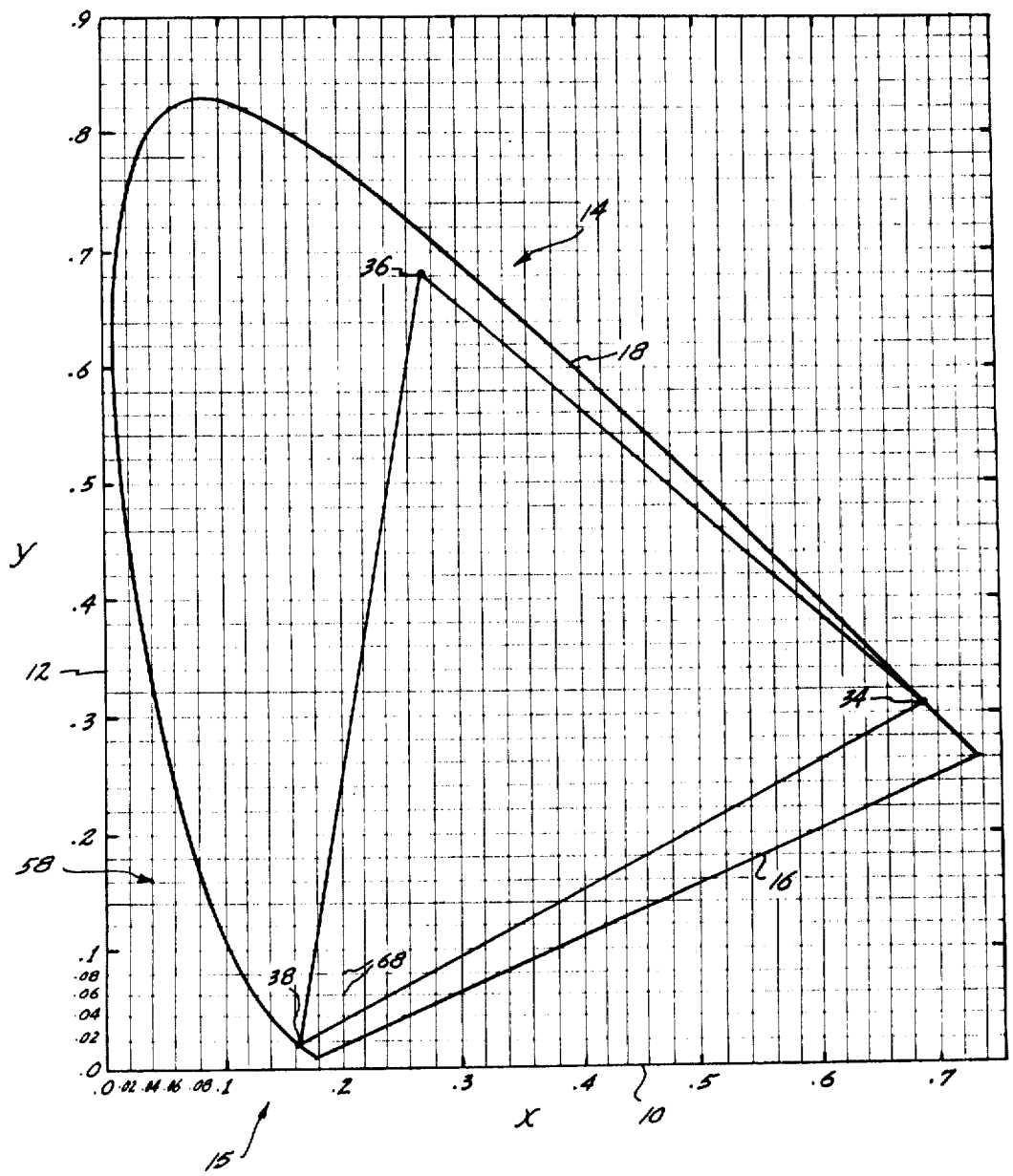
FIG. 6 is a pictorial representation illustrating the use of a working area in preparing a color reference data base.

The plurality of points may, of course, be selected by hand. However, referring now to FIG. 6, in order to provide a uniform and systematic method by which a plurality of points may be selected on the working diagram for use in preparing a color reference diagram or the like, it is preferred that a grid 58 of uniform spacing be superimposed over a blank, standard CIE diagram 14. Each intersection 68 on the grid is taken as a sample in the preparation of the color reference CIE diagram. Thus, for example, the grid shown in FIG. 6 has a spacing of 0.02 units, wherein the units are arbitrary. Of course, a larger or smaller spacing may be chosen by the user depending on the order of accuracy needed. Or, more frequent points could be chosen for those areas on the CIE diagram in which the user is particularly interested. In addition, it is to be emphasized that the grid 58 shown in FIG. 6 is merely used as an example of an organizing chart, and that any other forms of organizing chart or data development to help select sample points, is within the scope of the present invention.

After the plurality of color points are selected, a comparison of the methods shown in FIGS. 2 and 5 reveals that all of the steps shown encompassed by the dotted line in FIG. 5 are analogous to the corresponding steps shown in FIG. 2. The only difference is that in FIG. 5 the colored swatch and complement of the colored swatch are used, respectively, instead of the target color and complement of the target color in FIG. 2. Inasmuch as the method shown in FIG. 2 has been explained previously in considerable detail, no further discussion of the manner of photographically preparing each colored swatch 62 need again be given.

As an aid in selecting which filters 34, 36, 38 to use in the preparation of the colored swatches 68, it should be recalled that any set of color filters produces only those colors located on or within the filter triangle they define. Thus when dealing with positive photographic media, if a set of filters of widely differing colors is selected, such as the red, green and blue filters 34, 36, 38 shown in FIG. 6, a relatively lrge number of the colored swatches can be produced with only this single set of filters. Thus, by utilizing this technique of selecting filters of widely differing colors, it is seen that the number of filters needed to cover large portions of the working diagram 15 may be greatly reduced.

Of course, the use of a set of filters forming a filter triangle covering a large portion of the working diagram 15 also makes it more probable that any given target color will lie within this filter triangle. Thus, the same set of filters may be used to produce both the needed portion of the color reference diagram and the target color.

It should be noted that a great advantage of the method of the present invention is that it can be utilized to produce a target color with an illuminant source having any color temperature (Kelvin). However, for the most accurate results, certain constraints in the color temperature of the illuminant source must be observed.

As is explained in greater detail subsequently, the color temperature of the particular illuminant source used affects the location on the working diagram of many of the plotted points utilized in the present method. Among the plotted points affected are those for the illuminant source, the color filter elements, the target color and the complement of the target color. In addition, it will be seen that the pattern of colors making up the color reference data base will also change as the temperature of the illuminant source changes, as will the saturation times of the color filters.

thus, it will be apparent that for best results in practicing the method of the present invention, the illuminant source used in preparing the color reference data base and in determining the filters' saturation times should have the same Kelvin temperature as that used to produce the target color. This same temperature must also be used in determining the coordinates or equivalent data point of the illuminant source, the filters, the target color, and the complement of the target color. The temperature of the illuminant source may be easily determined in many ways, as for example, with a Kelvin meter.

In addition, the illuminant source(s) also should have the same spectral distribution. The spectral distribution of an illuminant source may be obtained from a variety of sources, including its manufacturer. Naturally, even though the properties of a particular illuminant source slowly change as it ages, one can ensure to a considerable degree the desired constancy of illuminant color temperature and spectral distribution merely by using the same illuminant source during continuing practice of the present invention. Failure to use illuminant sources of the same color temperature and spectral distribution will cause some inaccuracy in the results obtained which may be acceptable if the particular user does not need a high degree of accuracy.

For the purposes of the present invention, it may be assumed that most incandescent illuminant sources of the same Kelvin temperature have substantially the same spectral distribution, and thus an independent determination of spectral distribution need not be made. Of course, if inaccurate results are encountered, then the spectral distributions must be checked. Care must be taken since nonincandescent illuminant sources, such as fluorescent light, seldom have the same spectral distribution as an incandescent illuminant source of the same color temperature.

One of the outstanding features of the present invention is that once a color reference data base is prepared for an illuminant source of a particular color temperature and spectral distribution, it may be used again as a reference in the future at any time when an illuminant source having the same or similar color temperature and spectral distribution is being used to produce a target color. Further, once a color reference diagram or equivalent data base has been prepared for an illuminant source of a particular color temperature and spectral distribution, it may be easily reproduced by conventional photographic or printing means or computer programming for use by others in carrying out the present invention. Thus, it is within the scope of the present invention that a series of color reference diagrams or equivalent data bases be prepared, each for an illuminant source of a different color temperature and spectral distribution, and particularly for those light sources commonly used in the photographic art. These may then be distributed as an aid to others practicing the present invention.

PRE-PRESS COLOR PROOFING

As earlier indicated, one very practical application of the method of target color reproduction of the present invention is in the field of color printing where it is commercial practice to produce printed color reproductions utilizing four so-called color separation components, in the form of films, masks or the like. This practice, known as pre-press color proofing, involves producing from a given set of color separation components and a given set of printer's inks (e.g. yellow, magenta, cyan and black) a sample or "proof" of what printed color reproductions will look like without actually having to prepare test printing plates.

The target color reproduction method of the present invention offers a simple and straightforward pre-press color proofing technique whereby a given set of color separation components is proofed on photograhpic paper in a manner showing what the printed color reproduction will be like if printed on paper or the like with a given set of printer's inks or the like, the color proof being "printed" directly by use of a light source and color filters rather than by use of the inks, with filtered light exposure times coordinated to the ink colors.

In applying the technique of the present invention to the making of color proofs from color separation components, each separation film, for example (which is a black film base, positive or negative), is simply a masking overlay controlling the areas of the photographic print paper which are exposed to selected sets of filters for selected times simulating the color composition of the inks. By this technique, the "printing" of the photographic paper is accomplished by light in essentially the same manner as a printer would print with inks, i.e. with all colors "printed" on a single non-transparent sheet of paper, as distinguished from conventional color proofing techniques which commonly involve each primary color and black being developed on separate transparent sheets which are superimposed to simulate the final printed reproduction.

As a specific example of application of the present invention to printed color reproduction color proofing, it will be understood that color separation components, as made or available in the color printing field, are derived in a number ways, such as though a camera process, conventional per se, which provides four color separation films, each of which in appearance is a black film base, positive or negative. but which constitutes respective records of the yellow content, the magenta content, the cyan content, and the black content of the original. Each such black base film is in effect a mask made of more or less microscopic dots or continuous tones which either partially pass (a negative film) or partially block (a positive film) light in the course of preparing the corresponding color printing plate to be used in the final printing process. EAch such "dot" or "tone" of the printing plate permits more or less of the corresponding ink to be applied to the paper on which the printed color reproduction is printed.

Figure 7:
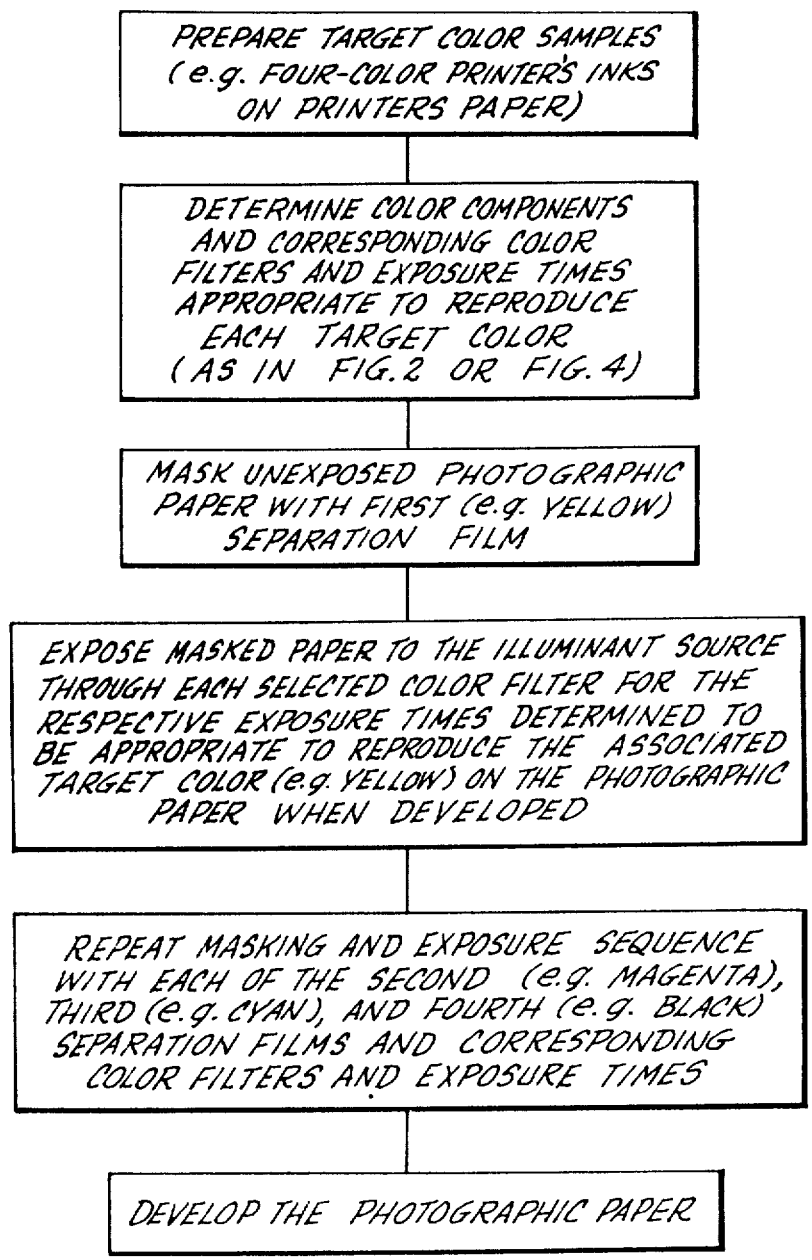
FIG. 7 is a block diagram outlining typical application of the present invention to pre-press color proofing.

As diagrammatically illustrated in FIG. 7, to obtain a color proof of what the printed color reproduction will be, using a given set of inks and a given set of color separation components, the printer or color proofer, in utilizing the concepts of the present invention, first makes so-called "draw down" samples of the four inks on the paper or like base which is identical to or at least similar in color and texture to the paper on which the printing run is to be made. These are simply samples or "swatches" of the yellow, magenta, cyan and black inks which the printer has tentatively selected for the printing. Each ink swatch thus produced is then subjected to color analysis, as by measurement with a densitometer or spectrophotometer, and comparison with a color reference data base as contemplated by the present invention (as in FIG. 2 or FIG. 4), to determine in each instance the red, green and blue components thereof, and a group of color filters is selected in each instance from which the color of each ink swatch, as a target color, can be reproduced from a given light source. As will be understood, with a given light source and with four swatches of a selected set of ink candidates (yellow, magenta, cyan and black), the analysis technique of the present invention provides the color proofer with information as to the identity of each of the group of color filters to be used in the reproduction of each of the four target colors (the ink swatches), and the light source exposure times to be used with each of the color filters to reproduce each of the four target colors.

With this information at hand, a selected photographic print paper (such as Kodak Ektacolor RC74 negative print paper, for example) is placed on pins in the exposure plane associated with the light source and filters (the pins matching pin holes in the separation films). The first (e.g. yellow) separation film is then placed on the unexposed photographic print paper, and the light source and first group of filters (e.g. the yellow group) are controlled to expose the photographic print paper to the light source and the first separation film in sequence through the associated group of color filters for the determined illumination times to reproduce the first ink target color image on the photographic paper when the paper is developed. The first separation film is then removed from the print paper, the second separation film (e.g. magenta) is superimposed on the paper, and the exposure process is repeated using the second group of color filters (e.g. the magenta group) and the associated exposure times determined for the second (e.g. magenta) ink swatch. The second separation film is then removed from the photographic paper and the third (e.g. cyan) separation film superimposed thereon, with the exposure sequence again repeated using the color filters of the third group of filters (e.g. the cyan group) and the associated exposure times determined from the target color analysis of the third (e.g. cyan) ink swatch. The third separation film is then removed from the photographic paper and the fourth separation film (e.g. black) superimposed thereon, with the exposure sequence again being repeated with the color filters of the fourth group of filters (e.g. the black group) and the associated exposure times determined for the fourth (e.g. black) ink target color swatch.

The resulting photographic paper, thus exposed, is developed in the conventional manner, and the resulting developed print is an image-wise color proof on a single sheet of opaque paper, accurately showing the color proofer what the finished printed color material will look like when printed on the selected paper or the like by use of the selected inks or the like and printing plates prepared from the selected color separation components, it being significant in this respect that the color proof is thus produced without test plates and without actual use (beyond the preparation of the original ink swatches) of the inks to be used on the paper to be used in the final color printing.

EXAMPLE OF PRE-PRESS COLOR PROOFING

As a specific example of the application of the present invention to color proofing, a set of color separation components was prepared from a graphic art overlay of a city tourist map and related text material. The color separation components, in the form of color separation films, were produced by compositing various screen effects into four color separation film negatives in a known manner. Specifically, various color effects were developed on GAF P4 20×24" line film negative, following which the color effects were composited on GAF HD 403 duplicating film for the four color separation components. Target color samples were obtained from the printer on coated web stock white paper (50 lb.) which were draw downs of the four inks to be used in the printing of the maps, namely, Acme Temp Yellow M-76325-A, Acme Temp Proc. Warm Red M-79535, Acme Temp Blue M-76326 and Acme Temp Black M-76990. The available illuminant light source was a GE tungsten map lamp rated at 100 watts at 20 volts, and the temperature thereof was measured to be 3050° Kelvin by a Gossen color temperature meter. The primary color components of the various samples were then measured by a GAM reflection densitometer, Model GAM 126P. The yellow ink sample was found to have a gray level of 13, a density (proportionate percentage) of 23 (13.6%) for blue, 30 (17.8%) for magenta, and 116 (68.6%) for yellow. The magenta or warm red sample was found to have a gray level of 45, a density of 29 (11.3%) for blue, 134 (52.3%) for magenta, and 93 (36.3%) for yellow. The cyan or blue sample was found to have a gray level of 96, a density of 151 (60.2%) for blue, 64 (25.5%) for magenta, and 36 (14.3%) for yellow. The black ink sample was found to have a gray level of 189, a density of 193 (33.2%) for blue, 193 (33.2%) for magenta, and 196 (33.6%) for yellow.

The x, y and z coordinates of the ink samples were determined by reference to the data base (or can be determined directly by use of a spectrophotometer), as follows:

| Ink Sample | x | y | z |
| --- | --- | --- | --- |
| yellow | .4973 | .4614 | .0275 |
| magenta | .6107 | .3312 | .0579 |
| cyan | .2245 | .3193 | .4560 |
| black | .4597 | .4063 | .1338 |

In this example, the filters chosen were the same as employed in the earlier example set forth, namely Kodak Wratten Photomechanical Filters Numbers 25 (red), 58 ) (green), and 47B (blue). In this example, the selected undeveloped, color sensitive photographic paper was Kodak Ektacolor RC 78, type NRC, manufactured by the Eastman Kodak Company. For this paper, the saturation times, adjusted as to each gray level, were determined as earlier set forth, for the red, green and blue filters, to be:

|  | Filter 25 (red) | Filter 58 (green) | Filter 57B (blue) |
| --- | --- | --- | --- |
| For gray level: |  |  |  |
| 13 (yellow) | 3.5 sec. | 8.2 | 18.3 |
| 45 (magenta) | 41.8 | 28.3 | 63.5 |
| 96 (cyan) | 89.2 | 60.4 | 135.4 |
| 189 (black) | 175.6 | 118.9 | 266.7 |

From the determined information as to the color component makeup of the samples, the characteristics of the available primary color filters, and the nature and saturation times of the given photographic paper in relation to the filters and illuminant source, the corresponding exposure times to substantially reproduce each target color on the photographic paper were determined, with reference to the color reference data bse, to be:

|  | Exposure of yellow separation film | Exposure of magenta separation film | Exposure of cyan separation film | Exposure of black separation film |
| --- | --- | --- | --- | --- |
| Filters |  |  |  |  |
| 25 (red) | 0.2 sec. | none | 103.7 | 85.7 |
| 58 (green) | none | 53.0 | 5.9 | 52.6 |
| 47B (blue) | 36.3 | 19.0 | 4.2 | 46.1 |

To extend the exposure times for improved control thereof in a manner known per se, each filter pack had included therewith a neutral density filter of 1.50 rating, to reduce the intensity of the light from the illuminant source, and also an ultraviolet absorbing filter, utilizing filters for these purposes which are commercially available from Eastman Kodak Company.

The photographic paper was exposed to the illuminant source successively through each filter for each of the indicated exposure times for each separation film in succession. Exposure times were controlled semi-automatically by a DIT 200 timer, marketed by Sergeant-Welch Company. With the photographic paper thus exposed, it was then eveloped in the conventional manner, according to manufacturer's specifications. The exposure and development cycle was completed in about fifteen minutes, and can be even faster if neutral density filters are reduced or not used. Upon drying, the developed photographic paper provided an accurate color proof of the proposed printing run based on the color separation negatives at hand, using the selected inks and printed on the type of paper presented.

Figure 8:
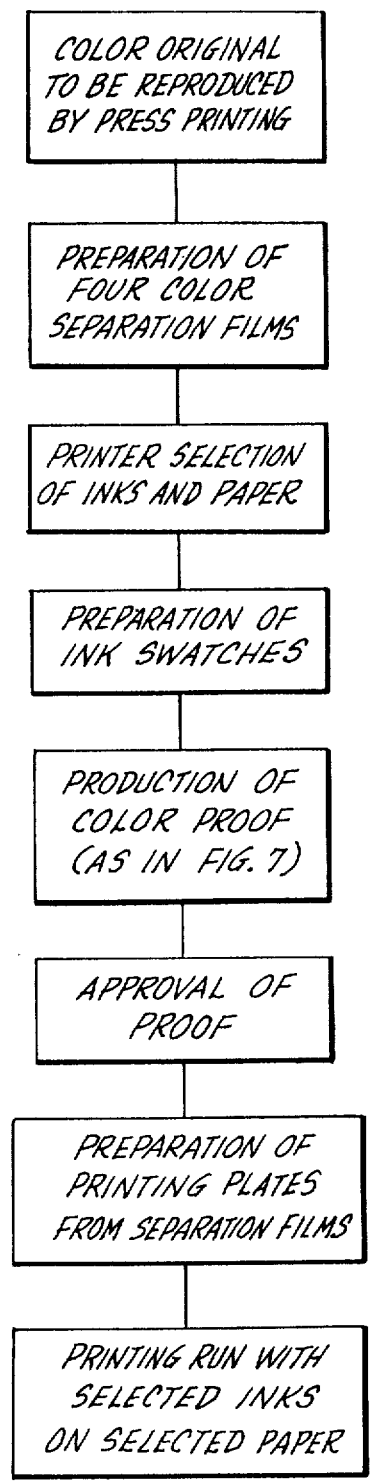
FIG. 8 is a block diagram outlining a typical color printing procedure including the production of a color proof from a given set of four-color separation films and a given set of printer's inks and printer's paper on the like, in accordance with the present invention.

FIG. 8 diagrammatically shows the overall color printing reproduction procedure utilizing the color proofing technique shown and discussed in connection with FIG. 7. Proceeding from a color original of either a two dimensional or three dimensional nature, four color separation components in the form of films were prepared in a manner conventional per se, such as by photography. As known, these separation films can be either positives or negatives and of a screened or half or continuous tone character. The color separation films may then either go directly to a printer who does his own color proofing, or to a specialty color proofing shop where the color proof is prepared for subsequent approval and delivery to a printing house. Given a set of color separation films and certain candidate inks and paper or like base on which the color reproduction is to be printed, the printer or color proofer prepares swatches of the inks on the printing base or reasonable facsimile thereof and then proceeds with the production of one or more color proofs, following the procedure illustrated and discussed in connection with FIG. 7. The resulting proof or proofs are then inspected and approved by the printing buyer, such as an advertising agency or the like. Printing plates in the respective colors are then prepared from the respective color separation films in a manner conventional per se, such as by known etching processes, and the resulting printing plates are utilized along with the respective selected inks and the selected paper or like printing base during the printing run, also in the manner conventional per se.

In utilizing this color proofing technique, it will be readily understood that it is applicable to a wide variety of color proofing needs, such as in the reproduction of original works of art or other art work, colord signs sample variations for textiles, wallpaper variations, paint color swatches, variations in rug pattern colors, plastics, or anything requiring a visual sample or samples of what a finished product might look like in color. Reproducing colors of natural products such as fruits or vegetables, or a glass of wine, for example, is also an application of the present technique, where the color components of the natural product can be measured directly with a spectrophotometer or the like and the colors reproduced on photographic paper by the target color reproduction technique of the present invention, then reproduced from given inks as a printed color reproduction, with the colors of the printed reproduction when printed being "proofed" in relation to selected inks by the color proofing technique of the present invention.

The technique of the present invention realizes marked improvement in color proofing cycle time. The apparent capability of the present process in this respect is a cycle time of about fifteen minutes or even less, as compared with a cycle time of about an hour for previously known pre-press color proofing processes, and as compared with a cycle time of at least several hours when using conventional press proofing techniques.

Various modifications, further adaptations and variations will readily occur to those skilled in the arts to which the invention is addressed. Thus, simply by way of further example, when dealing with color proofing, it will be recognized that other coloring proofing, it will be recognized that other coloring agents, such as pigments or dyes rather than printer's inks, may be equally well addressed by the target color reproduction technique of the present invention, and that the nature of the base to which the inks or the like (e.g. pigments or dyes) are to be applied may be readily varied. Thus, the particular nature of the printing paper (matte or glossy, for example), or other texture of the print base (which may be three dimensional such as equipment fronts or calculator keys or the like), can widely vary in practice and can be readily matched or at least closely simulated iin practice of this color proofing technique.

In utilizing the present invention, it is an important advantage and characteristic that the determination of the color constituents of the target color can take into account the color of the paper or other printing base itself, which of course contributes its colors to the colors of the ink or the like swatches.

Rather than requiring any particular color proofing films and any particular type of film or paper on which the color proof is to be developed, the color proofing technique of the present invention may be used with any photosensitive photographic paper of any texture, it being recognized of course that undeveloped photographic paper is commercially available or can be made to order in a wide variety of colors, textures and configurations and is a considerably more economic consumable than the specially prepared photopolymeric materials heretofore usually requird for pre-press color proofing.

The color proofing technique of the present invention, by means of which a color proof is obtained by successive exposure of undeveloped photographic paper to an illuminant light source through color separation components successively placed in register on the photographic paper and through successive color filters for successive exposure times calculated to substantially reproduce each color associated with each color separation component on the photographic paper when developed, is not necessarily limited to any particular technique for determining the color or color component makeup of the ink or the like with which each color separation component is correlated. Thus, in a given instance, the correlation between a given ink or the like and a given color separation film, or the like, in terms of the filters and exposure times necessary to substantially reproduce the ink color on a particular given photographic paper or the like, may be determined as a factory specification or be otherwise available to the color proofer. It is contemplated, for example, that a manufacturer and materials supplier to the color proofing and printing trade can provide the trade with a color proofing "package" involving an inventory of printer's inks or the like, an inventory of colored filters and illuminant source or sources, an inventory of types of undeveloped photosensitive photographic paper, and a computer or like equipment pre-programmed to correlate any particular ink and any particular paper with the available illuminant source(s) and color filters, and provide the appropriate corresponding filter exposure times, such computer or like equipment as furnished by the manufacturer providing to the color proofer a direct readout of the photographic paper to be used and the illuminant source, filters, and associated exposure times to be used in the given instance. It is further contemplated that, with these outputs, such an equipment could be automated in the sense that exposure of the paper through each color separation component and its associated group of filters would be automatically controlled by the equipment. At the beginning of a run with equipment having a given illuminant source, the color proofer manually inputs to the equipment the identity of the target colors to be reproduced (e.g. the printer's inks or the like to be used during the printing run), the characteristics of the paper to be used during the printing run, and possibly any corrective inputs desired such as modifications in hue or tone. The preprogrammed equipment would then automatically determine the group of filters and exposure times to be used to reproduce the color of each given ink or the like, and on demand would automatically sequence the filter exposures through each separation component. Operation of the equipment would involve the color proofer simply sequentially registering the first color separation component with the photographic paper, then activating the equipment to perform the filter exposure sequence associated with the ink correlated with that separation component, then removing the first separation component from the paper and registering the second separation component therewith, then again activating the equipment to perform the associated filter exposure sequence for the ink correlated with the second component, and so on until the paper is fully exposed through all separation components and associated filters. Following the exposure cycles, then, such equipment could also be automated to automatically develop the photographic paper and deliver the developed photographic media to the color proofer as the finished color proof.

In summary, a color reference data base usable for practice of the present invention characteristically has, as given inputs, the temperature and spectral distribution of a given illuminant source, the color component makeup and filter percentages of the various color filter elements available, and has, as variable inputs, the color component makeup or color component densities and gray level (lightness) of the given target color to be reproduced, and the color component makeup (emulsion constituency) and saturation time of the color photosensitive photographic media on which the target color is to be reproduced. From these various inputs the color reference data base provides, with reference to the given illuminant source and given photographic media, and with reference to the given target color presented, an identification of a group of one or more color filters usable for the target color reproduction, and in indication of the respective color filter exposure times to be used to reproduce the given target color on the given photographic media when developed.

As will be apparent, the above described procedures for calculating the requisite color filter percentages and the necessary filter exposure times can be accomplished by known computer techniques. Also, on occasion, more than one trial may be necessary to substantially reproduce a target color. Subsequent trials to achieve target color reproduction may proceed upon numerical analysis techniques based upon the results obtained in the immediately preceding trial. For example, as noted above, the new filter exposure times to be used in a subsequent trial may be calculated from the filter exposure times used in the immediately preceding trial. The calculations are repeated with iterative adjustment of variable inputs until substantial target color reproduction of the desired accuracy is achieved.

From the foregoing, various further applications, modifications and adaptations of the method disclosed by the foregoing preferred embodiments of the present invention will be apparent to those skilled in the art to which the present invention is addressed, within the scope of the following claims.

What is claimed is:

1. The method of preparation of a color proof from a set of color separation films, masks, or the like comprising:
    (a) preparing target color samples in the form of swatches made from respective primary color and black printer's inks and determining the color component makeup of each in relation to the illuminant source;
    (b) determining from the color component makeup of the samples and from the color reference data base, the respective color filters and respective exposure times appropriate to substantially reproduce each target color on the photographic media when developed, said color reference data base relating a given illuminant souce at a given Kelvin temperature and a given spectral distribution with various color filters and various color photosensitive photographic media, and providing information as to which filters and respective filter exposure times are appropriate, when used with the illuminant source and given photographic media, to substantially reproduce a given target color on the developed photographic media;
    (c) successively overlaying each color separation film, mask or the like on the undeveloped photographic media and exposing the photographic media to the illuminant source through each color separation film, mask or the like and its associated group of color filters for the determined respective exposure times to substantially reproduce each separation film color image in the associated target color on the photographic media when developed, and
    (d) developing the exposed photographic media to provide the color proof.

2. The method of claim 1, as applied to color proofing a set of color separation components based on color dyed carpet or rug material.

3. The method of claim 1, wherein the color component makeup of each target color sample is determined spectrophotometrically.

4. The method of color proofing a set of multi-color separation components, comprising:
    (a) successively overlaying an undeveloped color photosensitive surface and exposing the same to an illuminant light source through each color separation component in sequence, with the light source being exposed to the film and photosensitive surface in each instance through successive sets of color filters and for associated successive exposure times substantially reproducing each color image associated with each color separation component on the photosensitive surface when developed, the color reproduced in relation to each color separation component being substantially the color of the ink or the like to be used with a printing plate prepared from such color separation component; and
    (b) developing the photosensitve surface to provide the color proof.

5. The method of claim 4, wherein each color reproduced in relation to each color separation component substantially reproduces the color of the ink or the like to be used with a printing plate prepared from such color separation component.

6. The method of claim 4 or 5, wherein said color photosensitive surface is paper or the like simulating the surface on which printing is to occur using printing plates prepared from the set of color separation components.

7. The method of pre-press color proofing a set of color separation components from which color printing plates are to be made for color printing of a multi-color image on a paper or like printing base with a given set of printer's inks or the like, said method comprising:
    (a) preparing samples of the given inks or the like on the printing base or equivalent thereof;
    (b) determining the primary color component makeup of each sample in relation to a given illuminant source and, from a color reference data base based on such illuminant source, determining a group of color filters and associated color filter exposure times appropriate to substantially reproduce each sample color on a selected color sensitive photographic paper when the paper is exposed to the illuminant source through such filters for such exposure times;
    (c) successively overlaying each color separation component, mask or the like on the undeveloped photographic paper and exposing the undeveloped photographic paper to the light source in sequence through each color separation component and its associated group of color filters for the determined respective filter exposure times to substantially reproduce each separation color image in the associated sample color on the photographic paper when developed, and
    (d) developing the exposed photographic paper to provide a pre-press color proof.

8. The method of claim 7, wherein the color component makeup of each sample is determined spectrophotometrically.

9. The method of claim 7, as applied to color proofing a set of color separation components based on colord pictorial material.

10. The method of claim 7, as applied to color proofing a set of color separation components based on graphic art work.

11. The method of claim 7, as applied to color proofing a set of color separation components based on a three-dimensional object.

12. The method of claim 7, as applied to color proofing a set of color separation components based on a color dyed textile or fabric.

13. The method of claim 7, as applied to color proofing a set of color separation components based on pigmented paint.

14. The method of claim 7, as applied to color proofing a set of color separation components based on color dyed carpet or rug material.

15. A method of pre-press color proofing a set of color separation components, masks, or the like from which printing plates are to be made for color printing of a multi-color image on a paper or like printing base with a given set of printer's inks or the like, said method comprising:
   (a) preparing samples of the given inks or the like on the printing base of equivalent thereof;
   (b) illuminating the prepared samples with a given light source and determining the proportion of three primary colors of red, green and blue which constitute each sample color by comparing each said sample color to a data base comprising a plurality of colors constituted of said primary colors under illumination by a like light source whereby to select from said data base reference colors most similar to the sample colors and thereby identify groups of one or more color filter elements usable to reproduce each such reference color;
   (c) determining the exposure times for each color filter element of each group of color filters required substantially to reproduce the color of each sample color on color sensitive photographic material when developed;
   (d) exposing undeveloped color sensitive photographic material through each color filter element of each group and through each respective color separation component for a period corresponding to the exposure time thus determined; and
   (e) developing the exposed color sensitive photographic material thereby substantially to reproduce the multi-color image thereon.

16. The method of color proofing of claim 15, as applied to the preparation of a color proof from a set of four color separation components.

17. A method for pre-press color proofing of a colored image using color photographic material, a light source, a set of color filter elements, and a set of color separation films, said method comprising:
   (a) illuminating at least one sample of a selected printing ink with a light source and determining the proportion of three primary colors of red, green and blue which constitute said printing ink by comparing each said sample to a data base comprising a plurality of colors constituted of said primary colors obtained by illuminating said primary colors with a light source whereby to select from said data base a reference color most similar to the sample color and thereby identify a group of one or more color filter elements used to prepare said reference color;
   (b) determining the exposure time of each color filter element required substantially to reproduce the sample color on said color photographic material when developed;
   (c) exposing undeveloped color photographic material through the color filter elements and each respective color separation film of said set of color separation films using said illuminant source for a period corresponding to the exposure time determined for each respective color filter element and color separation film; and
   (d) developing the exposed color photographic material thereby substantially to reproduce the colored image thereon.

18. The method of claim 17 wherein said undeveloped color photographic material is exposed to said illuminant source in sequence through at least one color separation film.

19. The method of claim 17, wherein the color component makeup of each selected printing ink is determined spectrophotometrically.

20. The method of claim 17, as applied to color proofing a set of color separation films based on colored pictorial material.

21. The method of claim 17, as applieled to color proofing a set of color separation films based on graphic art work.

22. The method of claim 17, as applied to color proofing a set of color separation films based on a three-dimensional object.

23. The method of claim 17, as applied to color proofing a set of color separation films based on a color dyed textile or fabric.

24. The method of claim 17, as applied to color proofing a set of color separation films based on pigmented paint.

25. The method of claim 17, as applied to color proofing a set of color separation films based on color dyed carpet or rug material.

* * * * *